(12) United States Patent
Straboni

(10) Patent No.: US 8,405,183 B2
(45) Date of Patent: Mar. 26, 2013

(54) SEMICONDUCTOR STRUCTURE

(75) Inventor: Alain Straboni, Buxerolles (FR)

(73) Assignee: S'Tile Pole des Eco-Industries, Poitiers (FR)

( * ) Notice: Subject to any disclaimer, the term of this patent is extended or adjusted under 35 U.S.C. 154(b) by 433 days.

(21) Appl. No.: 12/760,086

(22) Filed: Apr. 14, 2010

(65) Prior Publication Data

US 2010/0258172 A1 Oct. 14, 2010

Related U.S. Application Data

(63) Continuation-in-part of application No. 12/184,703, filed on Aug. 1, 2008, now Pat. No. 8,192,648, and a continuation-in-part of application No. 10/552,548, filed as application No. PCT/FR2004/050151 on Apr. 9, 2004, now Pat. No. 8,105,923.

(30) Foreign Application Priority Data

Apr. 14, 2003 (FR) ...................................... 03 04676

(51) Int. Cl.
*H01L 31/102* (2006.01)
(52) U.S. Cl. ........................................ 257/463; 257/461
(58) Field of Classification Search .................. 257/431, 257/461, 463, 466
See application file for complete search history.

(56) References Cited

U.S. PATENT DOCUMENTS

| 3,151,379 | A | | 10/1964 | Escoffery |
|---|---|---|---|---|
| 4,281,208 | A | | 7/1981 | Kuwano et al. |
| 4,390,743 | A | | 6/1983 | Dahlberg |
| 4,514,580 | A | * | 4/1985 | Bartlett .......................... 136/250 |
| 4,759,887 | A | | 7/1988 | Geissler et al. |
| 4,762,687 | A | | 8/1988 | Belouet et al. |
| 4,849,033 | A | | 7/1989 | Vander Sande et al. |
| 4,851,358 | A | | 7/1989 | Huber |
| 4,947,219 | A | * | 8/1990 | Boehm .......................... 257/471 |
| 4,960,721 | A | | 10/1990 | Terashima et al. |
| 5,378,289 | A | | 1/1995 | Noguchi et al. |
| 5,431,127 | A | | 7/1995 | Stevens et al. |
| 5,770,324 | A | | 6/1998 | Holmes et al. |
| 6,348,428 | B1 | | 2/2002 | Misu et al. |
| 6,494,959 | B1 | | 12/2002 | Otsuki et al. |
| 6,849,242 | B1 | | 2/2005 | Koeppler et al. |
| 6,916,356 | B2 | | 7/2005 | Margaria |
| 7,002,071 | B1 | | 2/2006 | Sadatomi et al. |
| 7,563,404 | B2 | | 7/2009 | Straboni |
| 2002/0005213 | A1 | | 1/2002 | Otsuki et al. |
| 2002/0166256 | A1 | | 11/2002 | Samoilov et al. |
| 2006/0048698 | A1 | | 3/2006 | Hall et al. |
| 2007/0014682 | A1 | | 1/2007 | Hariharan et al. |

(Continued)

FOREIGN PATENT DOCUMENTS

| CA | 2355862 A1 | 6/2000 |
|---|---|---|
| DE | 2258305 | 5/1974 |

(Continued)

OTHER PUBLICATIONS

French Search Report dated Jun. 29, 2010 for related French application No. FR 0958441.

(Continued)

*Primary Examiner* — Bradley K Smith
(74) *Attorney, Agent, or Firm* — Howard IP Law Group, P.C.

(57) ABSTRACT

An electronic structure includes a first area having silicon grains having a size smaller than 100 micrometers and a second area superposed to the first area and having silicon grains having a size greater than or equal to 100 micrometers. The first and second areas form a support. At least one layer of an epitaxial semiconductor material is disposed on the second area.

16 Claims, 12 Drawing Sheets

U.S. PATENT DOCUMENTS

| | | |
|---|---|---|
| 2007/0023979 A1 | 2/2007 | Straboni |
| 2007/0178675 A1 | 8/2007 | Straboni |
| 2009/0028740 A1 | 1/2009 | Straboni |
| 2009/0039319 A1 | 2/2009 | Straboni |
| 2009/0056805 A1* | 3/2009 | Barnett et al. ............ 136/256 |
| 2009/0068465 A1 | 3/2009 | Chen et al. |

FOREIGN PATENT DOCUMENTS

| | | |
|---|---|---|
| DE | 19859288 A1 | 6/2000 |
| EP | 0230617 A1 | 8/1987 |
| EP | 0977274 A2 | 2/2000 |
| FR | 2038715 | 1/1971 |
| FR | 2479276 | 10/1981 |
| FR | 2666453 A1 | 3/1992 |
| FR | 2814757 | 4/2002 |
| GB | 1065773 | 4/1967 |
| JP | 5314914 B | 5/1978 |
| JP | 5229812 A | 9/1993 |
| JP | 9165212 A | 6/1997 |
| JP | 11092129 A | 4/1999 |
| JP | 11323538 | 11/1999 |
| JP | 2002151713 | 5/2002 |
| JP | 2002-533289 | 10/2002 |
| JP | 03124483 A | 4/2003 |
| WO | 9721253 A1 | 6/1997 |
| WO | 0068999 | 11/2000 |

OTHER PUBLICATIONS

Santana, C.J. et al., "The Effects of Processing Conditions on the Density and Microstructure of Hot-Pressed Silicon Powder", Journal of Materials Science, vol. 31, 1996, pp. 4985-4990.

Bere E., et al. "A New Technology for the Production of Silicon Sheets by Sintering of Silicon Powder Beds" 17th E.C. Photovoltaic Solar Energy Conference, Munich Germany Oct. 22-26, 2001, Proceedings of the International Photovoltaic Solar Energy Conference, Munich: WIP-Renewable Energies, DE, vol. 2 of 3 Conf. 17, Oct. 22, 2001, pp. 1799-1801.

Belogorokhov, A.I., et al., "Optical characterization of porous silicon embedded with CdSe nanoparticles", Applied Physics Letters, American Institute of Physics, New York, US, vol. 73, No. 19, Nov. 19, 1998, pp. 2766-2768.

Selvan, R.K., et al., "Combustion synthesis of CuFe2O4", Materials Research Bulletin, Elsevier Science Publishing, New York, US, vol. 38, No. 1, Jan. 1, 2003, pp. 41-54.

Chatterjee S. et al., "A miniature PTC thermistor based sensor element fabricated by tape casting technique", Sensors and Actuators B, Elsevier Sequoia, S.A., Lausanne, CH, vol. 60, No. 2-3, Nov. 23, 1999, pp. 155-160.

English version of Japanese Office Action, dated Jun. 1, 2010.

\* cited by examiner

SEMICONDUCTOR STRUCTURE

RELATED APPLICATIONS

This application is a continuation in part of U.S. application Ser. No. 12/184,703 filed Aug. 1, 2008 now U.S. Pat. No. 8,192,648, and is a continuation in part of U.S. application Ser. No. 10/552,548, filed Jan. 3, 2007 now U.S. Pat. No. 8,105,923, entitled SINTERED SEMICONDUCTOR MATERIAL, which is the national stage application under 35 U.S.C. §371 of the International Application No. PCT/FR2004/050151 filed Apr. 9, 2004 and claims the benefit of French Application No. 03/04676, filed Apr. 14, 2003 and Int'l. Application No. PCT/FR2004/050151, filed Apr. 9, 2004, the entire disclosures of which are incorporated herein by reference in their entireties.

FIELD OF THE INVENTION

The present invention relates to the field of semiconductors, and in particular, but not exclusively, of semiconductor materials usable to form photovoltaic cells, also called photocells.

BACKGROUND OF INVENTION

FIG. 1 shows a conventional photovoltaic cell 1. Photovoltaic cell 1 includes a planar semiconductor material 3. Material 3, generally made of polysilicon, has three areas of different doping. A thick central area 3a is lightly P-type doped. An upper area 3b is N-type doped, and possibly overdoped at its surface. A lower area 3c is heavily P-type doped (P$^+$). A conductive comb 5 is placed above area 3b, intended to be exposed to light. An aluminum layer 6 covers the lower surface of the cell. Comb 5 and layer 6 are both intended to transmit the photovoltaic current and are connected to the + and − terminals, not shown, of the cell. An antireflection layer, not shown, is preferably placed on area 3b and comb 5 to limit the reflection of light rays at the photocell surface.

Material 3 conventionally originates from a polysilicon bar obtained from a silicon melt. The bar is sawn to obtain wafers which are then doped to obtain material 3. This manufacturing method, close to the single-crystal silicon wafer manufacturing method, is expensive and limits the possible wafer dimensions.

The inventor has disclosed in a conference in Munich (17$^{th}$ European Photovoltaic Solar Energy Conference and Exhibition, Munich, 21-26 Oct. 2001) a method for manufacturing polysilicon wafers by sintering of silicon powders. In this method, silicon powders of 5 μm or 20 μm are placed between the plates of a press. The assembly is compressed with a pressure P ranging between 70 MPa (700 bars) and 900 MPa (9,000 bars). Then, the compacted layer is introduced into a sintering furnace, where it is heated up to a temperature T ranging between 950° C. and 1050° C. The sintering, which enables growth of bridges between the grains and stiffening of the material, has been performed at the indicated temperatures for a time range from two to eight hours, under a low argon pressure (100 Pa).

The obtained materials have a sufficient mechanical strength to be able to be handled. However, their porosity is high, above 15%. Further, the grain size is small, since the size of said grains has not substantially increased during the processing. The mobility-lifetime product of the minority carriers is low, on the order of $10^{-7}$ cm$^2$V$^{-1}$ ($10^{-11}$ m$^2$V$^{-1}$ in the international system). The obtained materials are unusable in the photovoltaic field. For example, due to the high porosity, it is impossible to dope a specific area of the material, the dopants migrating through the porosity channels and spreading everywhere inside the material. As to the mobility-lifetime product of the minority carriers, values at least one thousand times greater are required for the material to be used in a photocell. Further, the surface of the obtained materials is uncontrolled and rough. Such a surface state prevents the provision of surface junctions, necessarily poor, in particular because of significant leakage currents.

SUMMARY OF THE INVENTION

According to an aspect of the present invention, a semiconductor material or component is formed by sintering of semiconductor powders, which semiconductor material or component is usable in the electronic field, especially in the photovoltaic field.

According to another aspect of the present invention, a semiconductor material is formed by sintering of semiconductor powders exhibiting a low roughness and/or a controlled texturation surface condition.

Yet another aspect of the present invention provides a method for forming a semiconductor material from powders including at least one component belonging to the group formed by the elements of column IV of the Mendeleev table and their alloys. The method includes a step of compression of the powders and a thermal processing step such that at least part of the powders is melted or made viscous.

According to an embodiment of the present invention, the compression and thermal processing steps are simultaneous.

According to an embodiment of the present invention, the thermal processing is such that only powders belonging to a specific area of the material are melted or made viscous.

According to an embodiment of the present invention, the powders include silicon powders and powders of at least one other component, the thermal processing being such that the silicon is not melted and that the at least one other components is melted or made viscous.

According to an embodiment of the present invention, the powders include doped semiconductor powders and undoped semiconductor powders, the thermal processing being such that only the doped powders are melted.

According to an embodiment of the present invention, the compression step is preceded by a step consisting of placing powders on a plate, the powders being different as to their nature, their granulometry, and/or their doping according to their location on the plate.

According to an embodiment of the present invention, in the compression step, the powders are pressed between plates having a surface capable of texturizing the surface of the material.

The present invention also provides a semiconductor material obtained at least partially by compression and thermal processing of powders including at least two distinct areas formed of distinct components belonging to the group formed by the elements of column IV of the Mendeleev table and the alloys thereof.

According to an embodiment of the present invention, the areas are superposed.

The present invention also provides a structure or component formed of at least one semiconductor material including grains and/or aggregates exhibiting energy gaps of different value.

The present invention also provides a method for forming a material from a source material including the following steps:

grinding the source material to get powders if the source material is not already in the form of powders;

sintering the powders with at least one compression step and one thermal processing step; and purifying the material with a gas flow, the gas flow passing through the porosity channels of the material.

According to an embodiment of the present invention, the gas is a non reactive gas.

According to an embodiment of the present invention, the gas includes at least one reactive gas which reacts with determined impurities of the material in order to form volatile components which are carried out of the material by the gas flow.

According to an embodiment of the present invention, the gas includes hydrogen or an element of the halogen family, like fluorine, chlorine or bromine.

According to an embodiment of the present invention, the gas is a mixture of a non reactive carrier gas and at least one reactive gas.

According to an embodiment of the present invention, the gas flow is produced by pumping, the gas pressure being the atmospheric pressure or a pressure comprised between 1 hectopascal and the atmospheric pressure.

According to an embodiment of the present invention, the gas has a pressure greater than one atmosphere.

According to an embodiment of the present invention, the purification step takes place after the sintering process, but before a liquid phase appears in the material if a liquid phase is needed.

According to an embodiment of the present invention, the purification step is simultaneous with at least one compression step and/or one thermal processing step.

According to an embodiment of the present invention, the sintering step includes a hot pressing step.

According to an embodiment of the present invention, the sintering step includes at least one cold compression step followed with at least one thermal processing step.

According to an embodiment of the present invention, the material is a semiconductor material which may be used in the photovoltaic, electronic and/or microelectronic field.

According to an embodiment of the present invention, the material is a wafer.

According to an embodiment of the present invention, the wafer has a thickness comprised between 100 and 300 micrometers.

According to an embodiment of the present invention, the powders used in the sintering step are powders including at least one component belonging to the group formed by the elements of column IV of the Mendeleev table and their alloys.

The present invention also provides a structure having a first layer made of sintered silicon powders and a second layer made of single-crystal silicon.

According to an embodiment of the present invention, the structure further includes a layer forming a diffusion barrier between the first and second layers.

According to an embodiment of the present invention, the structure further includes an insulating layer between the first and second layers.

According to an embodiment of the present invention, the insulating layer or the layer forming the diffusion barrier is a layer made of silica, silicon nitride and/or silicon carbide.

According to an embodiment of the present invention, the first layer has a thickness greater than 50 micrometers and/or the second layer has a thickness comprised between one and 50 micrometers.

According to an embodiment of the present invention, the layer forming a diffusion layer has a thickness lower than 10 nanometers and/or the thickness of the insulating layer has a thickness larger than 10 nanometers.

According to an embodiment of the present invention, the porosity channels of the structure include a doping element or a conductive material.

According to an embodiment of the present invention, holes pass through the first layer and the insulating layer if the insulating layer is present.

The present invention also provides an electronic structure having:

a first area having silicon grains having a size smaller than 100 micrometers;

a second area superposed to the first area and having silicon grains having a size greater than or equal to 100 micrometers, the first and second areas forming a support; and one or several layers of an epitaxial semiconductor material on the second area.

According to an embodiment of the present invention, the support has a doping concentration greater than $10^{18}$ atoms per cubic centimeter (atoms/cm$^3$) obtained by means of dopants of a first and/or of a second type, and wherein the or at least one of the epitaxial layers has a doping concentration lower than $10^{18}$ atoms/cm$^3$ obtained by means of dopants of the first and/or of the second type.

According to an embodiment of the present invention, the thickness of the epitaxial layer(s) is smaller than the size of the silicon grains of the second area.

According to an embodiment of the present invention, the structure includes a first epitaxial layer adjacent to the support and doped with a dopant of same nature as that of the support and a second epitaxial layer thinner than the first layer, doped with a dopant of a different nature than that of the support.

According to an embodiment of the present invention, the structure includes an epitaxial layer adjacent to the support and doped with a dopant of different nature than that of the support.

According to an embodiment of the present invention, the support includes third areas with a doping of the first type alternating with fourth areas with a doping of the second type, and the epitaxial layer, doped with a dopant of the second type, includes fifth doped areas of the first or of the second type, the doping of the fifth areas resulting from the diffusion of the dopants of the third and fourth areas.

According to an embodiment of the present invention, an epitaxial layer includes several sub-layers of materials of different natures.

According to an embodiment of the present invention, the materials of the sub-layers are either pure silicon, or pure germanium, or a silicon and germanium alloy of formula $Si_xGe_{1-x}$, x being a parameter that may range from 0 to 1, depending on the considered sub-layer.

According to an embodiment of the present invention, the first type of doping is a doping of N or N+ type and the second type of doping is a doping of P or P+ type.

According to an embodiment of the present invention, the thickness of the support is greater than 100 micrometers, the thickness of the first area ranging between a minimum thickness equal to zero and a maximum thickness equal to the thickness of the support minus 100 micrometers.

According to an embodiment of the present invention, the support is not planar and/or has any shape.

The present invention also provides a photovoltaic cell comprising an electronic structure as described above.

According to an embodiment of the present invention, the photovoltaic cell includes an antireflection layer and/or ohmic contact areas arranged on the two cell surfaces or on a single surface of the cell.

BRIEF DESCRIPTION OF THE DRAWINGS

The foregoing features, and advantages of the present invention will be discussed in detail in the following non-limiting description of specific embodiments in connection with the accompanying drawings, among which.

DETAILED DESCRIPTION OF THE INVENTION

Figure 2:
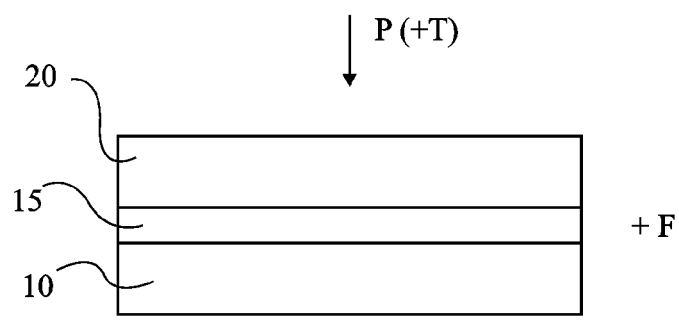
FIG. 2 illustrates an exemplary method according to the present invention.

FIG. 2 illustrates an exemplary method according to an aspect of the present invention.

On a lower plate 10 is placed a bed of semiconductor powders 15, for example, silicon powders. An upper plate 20 covers powders 15. The assembly is placed in a processing enclosure and semiconductor powder layer 15 is compacted by application of a pressure P. The compaction may be performed by cold pressing, that is, at room temperature, or by hot pressing, at a temperature T, for example ranging between 950 and 1,300° C.

According to an aspect of the present invention, the sintering is performed at least partially in liquid phase, that is, before or after the compression, a thermal processing such that at least part of the powders is melted, is applied. This is symbolized by letter F in FIG. 2. In the present disclosure, terms "liquid phase" and "melting" must be understood in a broad sense. As will be seen hereafter, "liquid phase" may also designate a viscous phase corresponding to an over-melted liquid, term "melting" then designating the "overmelting".

The partial melting may be performed in selective fashion, for example, according to the area in the material, to the nature of the powders, or according to the used heating means.

In the areas sintered in liquid phase, the porosity is substantially zero (in practice, lower than 0.2%). Also, the melting causes an increase in the grain size, which is desirable, the obstacle to the displacement of the carriers created by the grain boundaries being then decreased.

Although this is possible, it is not necessary for the entire material to be sintered in liquid phase. Indeed, the inventor has found that it is not required for the features of a material intended to form a photocell to be homogenous throughout the entire material.

For example, in a photovoltaic cell, the so-called "absorbing" portion, that is, the area intended to turn the received photons into electron-hole pairs, must have a microstructure of very high quality, that is, a porosity as close as possible to zero and the largest possible grain size. The portion forming the junction (or collection area), intended to collect the carriers, must also exhibit this type of features.

However, other areas in the material do not need a high-quality microstructure and may exhibit, with no disadvantage, a poor porosity. Such areas for example are the heavily-doped N-type or P-type conductive areas used as a contact with the N and P areas of the junction. It is enough for these areas to exhibit a sufficient conductivity, and a porosity as high as 40 or 50% may be sufficient.

Accordingly, according to an aspect of the present invention, the thermal processing may be carried out to selectively cause a melting only in the areas where a high-quality microstructure is desired.

A few examples of obtained materials will be given hereafter.

A number of trials have been carried out with pressures ranging between 10 MPa and 30 MPa (100 and 300 bars). The temperatures have ranged between 950° C. and 1,350° C. The used powders have been either pure silicon powders, or silicon powders mixed with powders of other elements from column IV of the Mendeleev table, such as germanium, or silicon powders mixed with powders of non-semiconductor materials, such as silica $SiO_2$. The granulometry of the used powders has ranged between 20 nanometers and 700 micrometers. The obtained results are spectacular.

It should be noted that, according to an aspect of the present invention, it is possible to easily control the morphology of the surface of the obtained material. Indeed, especially when the partial melting step occurs during the compression, the surface of the material faithfully reproduces the surface of plates 10 and 20. With planar and smooth plates, the surface, analyzed by electronic microscopy, appears as an even plane with a very low roughness.

It should also be noted that an advantage of performing a hot pressing of the powders, rather than a cold pressing, is that this provides a material exhibiting a low general porosity within a relatively short time, which results in time, power, and cost savings.

It should also be noted that the liquid phase into which the material passes at least partially may be of very short time, for example, shorter than one minute.

For example, in a practical example, powders of a 20-nanometer size, sintered for half an hour by hot pressing under a 120-bar (12 MPa) pressure at a 1,325° C. temperature, provide a material with a porosity close to 4%. It will be understood that the term "size" or "grain size" may refer to a diameter of a grain or any other predominant dimension of a grain. A thermal processing by laser beam causing a surface melting of the material will enable decreasing the porosity of the surface layer of the material down to practically zero.

It should be noted that the partial melting step is not necessarily distinct from the actual sintering step. The partial melting step may be carried out simultaneously to the compression.

Examples of implementation of a method according to the present invention will now be given.

The lower plate 10 and upper plate 20 are mechanical plates, sufficiently strong to enable the compression. Plates 10 and 20 are compatible with the nature of the used semiconductor powders to avoid introducing impurities. For example, the plates may be made of graphite or silicon carbide.

The powders of layer 15 for example are powders of pure silicon or silicon enriched in elements from column IV of the Mendeleev table, such as carbide, germanium, tin, or their alloys. Powders of other semiconductors may also be used, and germanium and gallium arsenide (GaAs) materials may be formed by sintering.

The powders used may be of nanometric, micrometric, or even millimetric size. Preferably, the size of the powders is smaller than the thickness of the material which is desired to be obtained. However, it may also be slightly greater, the powders being crushed during the sintering. A mixture of powders of various granulometries may also be performed to form powder bed 15, especially to conveniently and efficiently control the general porosity or that of areas of the obtained material.

The powders used may originate from residues of the sawing of single- or polycrystal semiconductor ingots. Very small powders resulting from byproducts of the decomposition reactors of the silicon composites, such as silane or trichlorosilane gases, may also be used. Such powders, typically on the order of 20 nanometers, currently have no industrial use. They are very inexpensive and their use makes the exemplary method according to the present invention even more economical.

Powder bed 15 may be formed in various manners. For example, one or several powder piles may be placed in various locations of plate 10 and the desired thickness may be equalized by means of a scraper. Powder bed 15 may also be formed by aerosol. In this case, a gas containing floating particles is sent to the processing enclosure. The particles deposit on plate 10 and form powder bed 15. Also, it is possible to use masks to place the powders at specific locations of layer 15.

It should be noted that the conditions of implementation of the method (pressure, thermal processing, powder nature and granulometry, processing time) enable controlling the features of the obtained materials and adjusting them in desired fashion.

A way to obtain the liquid phase (possibly, the viscous phase) is to use of mixture of powders such that part of the components melts (possibly, is made viscous) during the thermal processing which occurs, as it should be reminded, either during the compression step, or after.

For example, a homogenous mixture of germanium and silicon may be formed and brought to a temperature ranging between 937 and 1,410° C. The germanium melts (melting temperature 937° C.), but not the silicon (melting temperature 1410° C.). By melting, the germanium eases the transportation of silicon atoms from one silicon grain to another, as they aggregate. Further, the germanium spreads into the pores and clogs them, which results in the desired decrease in porosity. The same result may be obtained with a mixture of silicon and tin.

A sintering in liquid phase may thus be obtained by mixing powders of various materials, such as glass powders or ceramic materials, with the silicon powders. For example, the silica powders become soft and pasty from approximately 1100° C. and may also be used as a melting agent to sinter the silicon powders. It should be noted that, in this case, it is not properly speaking a liquid phase, and that this term rather designates a viscous phase, resulting from the passing of a component to the overmelted liquid state.

Generally, the liquid phase may be partially or totally evacuated during or after the sintering, for example by an anneal at high temperature, for example, greater than 1,200° C. in the case of germanium. The liquid phase evacuation may also be favored by pumping at a pressure lower than the partial pressure of the considered component.

According to an aspect of the present invention, the mixture of silicon and melting agent powders need not be homogenous. For example, in a photocell where absorbing portion and junction are on a same surface, the melted portion of the powders only needs involving the surface portion of the mixture. This may be obtained by performing a surface heating by laser beam. This may also be obtained by forming a layer 15 in two sub-layers, a lower sub-layer with silicon powders and an upper sub-layer with a mixture of powders of silicon and melting agent, germanium, for example, only the melting agent melting during the sintering. The obtained material is a material including a surface area exhibiting a high-quality structure.

The liquid phase may also be obtained by selectively melting powders exhibiting a specific doping type. Thus, for example, in a mixture of doped silicon and pure silicon powders, the doped powders may selectively be melted by induction, since their conductivity is higher than that of silicon.

Of course, in an exemplary method according to the present invention, several compression steps and/or several thermal processing steps may take place. The pressure and/or the temperature may vary along the implementation of the method according to the present invention. For example, the pressure may be exerted for a time shorter than the thermal processing. Also, the pressure may be applied intermittently during the thermal processing. Also, the thermal processing may include several steps, only one or several of which cause the melting.

It should also be noted that a stacking of several mechanical plates imprisoning several beds of semiconductor powders may be formed, to manufacture a great number of materials at the same time.

Figure 3:
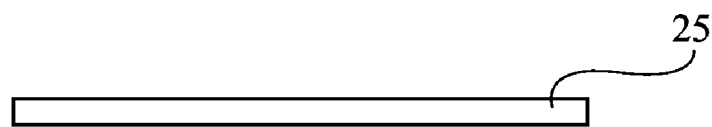
FIG. 3 shows a material according to an embodiment of the present invention.

FIG. 3 shows a material 25 obtained by the method of FIG. 2. Material 25 appears in the form of a thin wafer, of a thickness typically ranging between 100 and 1000 μm. If need be, greater thicknesses, 2000 for example, or lower thicknesses, such as 50 μm may be provided. Material 25 is mechanically strong, of adapted porosity and its surface state is optimal. The dimensions of material 25 may be quite large.

Figure 4:
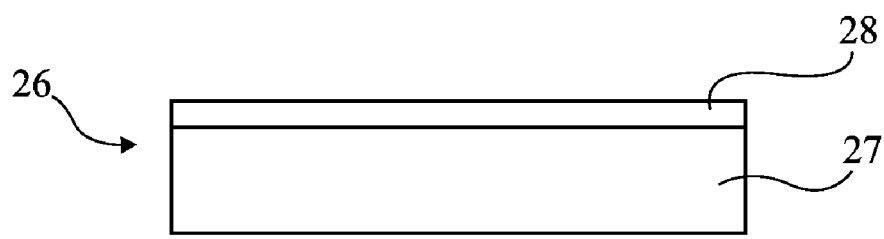
FIG. 4 shows a structure according to an embodiment of the present invention.

FIG. 4 shows a structure 26 according to an embodiment of the present invention. Structure 26 includes a mechanical support 27, such as an insulating or conductive ceramic, graphite, glass, a metal, or an alloy, on which is fixed a semiconductor material 28. Structure 26 is very robust and may be obtained in several manners. For example, material 25 of FIG. 3 may first be formed and fixed in any manner, for example, by gluing, to support 27. To form support 27, one of the two plates 10 or 20 of a nature such that the semiconductor material adheres thereto during the sintering of the powders of layer 15 may also advantageously be used. Such a plate is for example formed of silicon carbide (SiC), silicon nitride ($Si_3N_4$), silica glasses enriched or not with boron, phosphorus, and nitrogen. Structure 26 is thus directly obtained by the illustrated method of FIG. 2. Structure 26 may have any thickness. Support 27 may have a rather low thickness, for example, from one to a few millimeters, or rather high, for example, from one to a few centimeters. Structure 26 may be, for example, preferred in the case of semiconductor materials 28 of small thickness, for example, 50 micrometers, or when it is desired to form semiconductor wafers of very large dimension.

Material 25 and structure 26, very inexpensive, may be used as a base to form photovoltaic cells, by application of conventional doping, and metallization methods. However, the photovoltaic field is not the only possible application of material 25 or of structure 26.

For example, material 25 or material 28 of structure 26 may be used as a support for semiconductor layers deposited afterwards, which then are the active layers, materials 25 and 28 only being used as a support. This application is particularly advantageous. Indeed, materials 25 and 28 are compatible with the deposited layers, and in particular have the same expansion coefficient. In the deposition of the active layers, for example, in vapor phase, the high temperature then poses no problem of expansion difference between the deposited layers and the plate.

For example, material 25 or structure 26 may form wafers used for components for CCD cameras or flat screens, where such components may include transistors in thin layers.

A few possibilities provided by the method according to an aspect of the present invention, relating to the texturation of the materials, their doping, and the forming of "composite" semiconductor materials, will now be described.

Figure 5A:
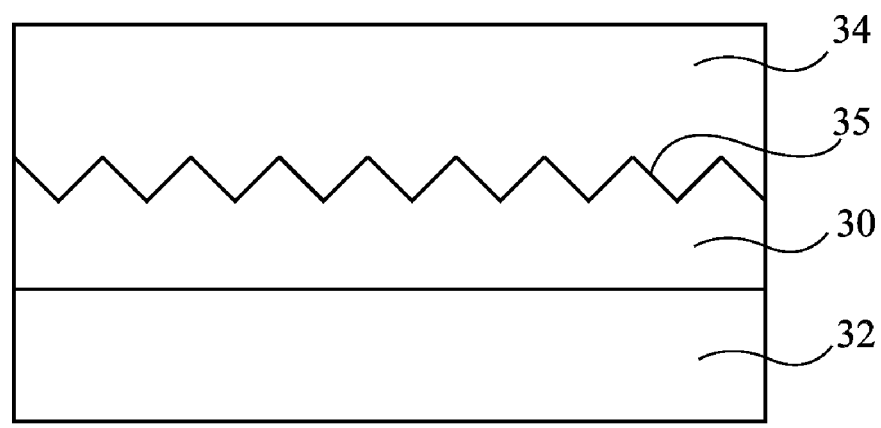
FIGS. 5a and 5b illustrate other exemplary methods according to the present invention.

FIG. 5a illustrates an exemplary method according to the present invention in which a layer of semiconductor powders 30 is placed between a lower plate 32 of planar surface and an upper plate 34 having its lower surface exhibiting indentations 35. Indentations 35 may have a size on the order of one fifth of the thickness of layer 30. In the compression step(s), the lower surface of plate 34 prints the pattern of indentations 35 in layer 30. The material obtained by sintering of layer 30 faithfully keeps, at its surface, the pattern transmitted by plate 34. The texture of the material surface thus is perfectly controlled and it may for example be adapted to a better absorption of light. It goes without saying that it is preferable to carry out, in this case, the thermal processing leading to the partial melting during the compression step, to optimally keep the pattern transferred by the plate. Of course, the partial melting may also occur after, if the pattern modification due to the melting does not adversely affect the desired features.

Figure 5B:
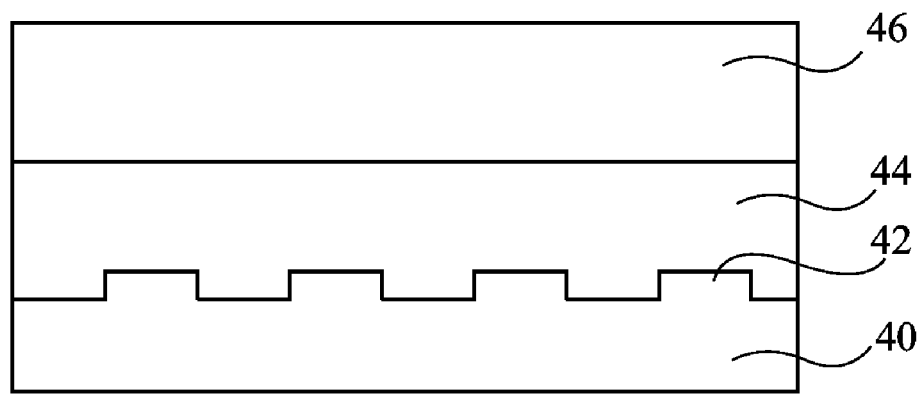

FIG. 5b illustrates another example of a texture that may be obtained at the surface of a material according to the present invention. A lower plate 40 exhibits parallel parallelepipedal ribs 42. A bed of semiconductor powders 44 is placed on plate 40 and topped with an upper plate 46 of planar surface. After implementation of the method according to the present invention, the obtained material exhibits at its surface parallel depressions corresponding to the ribs of plate 40. As will be seen hereafter, such depressions may be filled with another material.

Various ways of doping the material according to an aspect of the present invention will now be described through a few examples, in relation with FIGS. 6, 7A to 7C.

First, in an exemplary method of the present invention, it is possible to use previously-doped powders of semiconductor materials. The sintering of such powders provides a readily-doped material.

The obtained doping may be homogenous, when powders of a specific doping type, N or P, are uniformly distributed between the compression plates. Separate areas exhibiting a doping of different type and concentration may also be formed within the material by adequately distributing more or less heavily doped N- or P-type powders.

As seen, in the case of a mixture of pure silicon and doped silicon powders, the liquid phase may be obtained by only melting the doped powders. It should be noted that this further provides the advantage of decreasing down to almost zero the porosity of the doped areas. It may also be provided to only melt some of the doped areas.

A doped material may also be obtained by sintering a bed of undoped semiconductor powders to which are mixed dopants or impurities in the form of powders, such as boron, phosphorus, antimony, arsenic, gallium, and aluminum. It should be noted that these components melt easily and that, in melting, they optimize the microstructure of the area where they are present.

A homogenous doping of the material may also be obtained by means of undoped powders and by flowing a gas carrying dopant elements in the implementation of the method according to the present invention. Indeed, at the beginning of the processing, the porosity of the powder bed is very high, for example, on the order of 50%. The porosity is said to be open, that is, there exists, within the powder bed or the material being formed, interconnected circulation channels emerging outside. If a dopant gas then flows, the dopant gas spreads throughout the entire material and dopes it uniformly. The partial melting step, which clogs the porosity channels, must only take place after the doping or in areas which do not involve it.

To form a PN junction, an N-type material may be formed by sintering of powders. It is locally melted, for example, at its surface. It is then doped with a P-type doping via porosities, for example, by a gas. The portions which have not melted are P-type doped, while the portions having melted, with no porosity, keep the N-type doping. A large PN junction may thus be formed.

Figure 6:
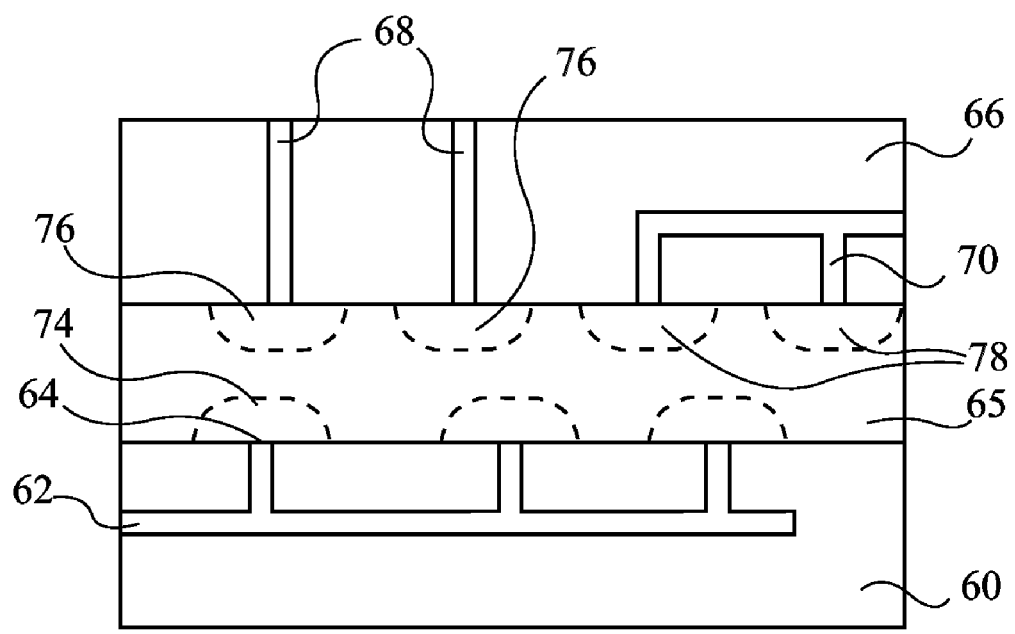
FIGS. 6, 7A to 7C illustrate exemplary ways of doping a material according to an aspect of the present invention.

FIG. 6 illustrates another way of doping the material during its forming. A lower plate 60 comprises a duct 62 emerging outside. Duct 62 further has openings 64 located at the upper surface of plate 60. A powder bed 65 is placed on plate 60 to form the semiconductor material. A plate 66 comprising ducts 68 and 70 emerging outside and at the lower surface of plate 66 is placed above. Ducts 68 each connect the outside of the plate to a specific opening of the lower surface of plate 66. Duct 70 connects the outside of plate 66 to several openings located on the lower surface of plate 66.

In the compression step, a dopant gas, for example, of type P, is sent into duct 62. This gas, due to the large number of open porosities existing at the beginning of the forming of the material, causes, in front of openings 64, the doping of areas 74 delimited in dotted lines. According to the gas sending conditions, the different doped areas 74 may join. The thermal processing step will have to be adapted to the desired result. Indeed, the open porosities close during the thermal processing step. According to the time of action of the gas in the process, it is possible to perform local dopings. Dopant gases are also sent into ducts 68 and 70 to respectively form doped areas 76 and 78. Since it is possible to separately modify the gas sending conditions into each of ducts 68 and duct 70, a size, a doping type and concentration may be obtained for each of areas 76 and 78. The phrase "Gas sending conditions" is especially used to designate the nature, the flow rate or the pressure, the action time of the gases, and the time when they act.

Another way of doping the material obtained according to another aspect of the present invention will now be described in relation with FIGS. 7A to 7C.

Figure 7A:
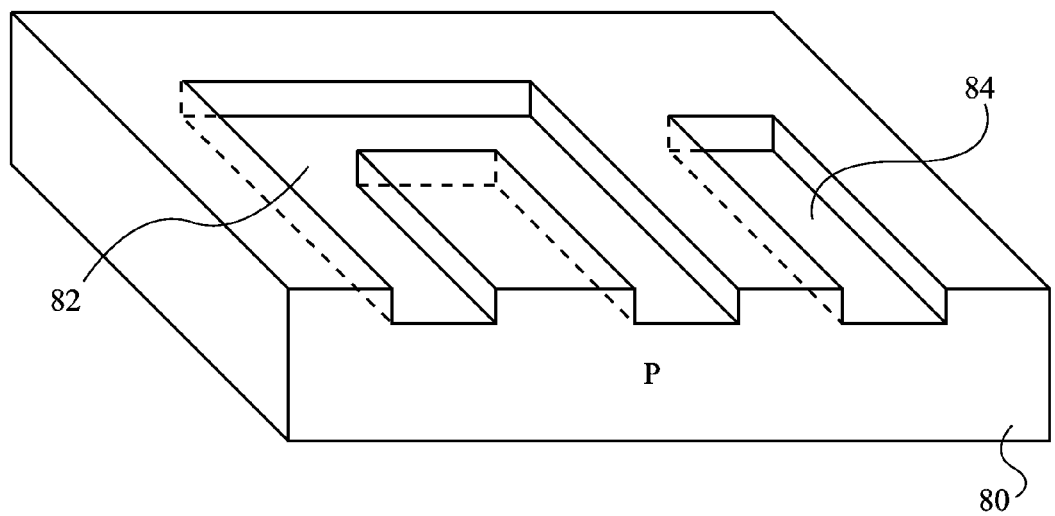

FIG. 7A schematically shows a view partially in cross-section and in perspective of a P-type material 80 obtained by sintering of powders according to an exemplary method of the present invention. Material 80 exhibits depressions 82 and 84 which have been obtained by means of a plate exhibiting protruding elements of corresponding shape, of a type similar to those of plate 40 of FIG. 5b. The width of depressions 82 and 84 may be as small as 1 μm. The edges of depressions 82 and 84 are well delimited. Depression 82 is meander-shaped and depression 84 is rectilinear. Depressions 82 and 84 are then each filled with semiconductor powders exhibiting a doping of desired type and concentration.

Figure 7B:
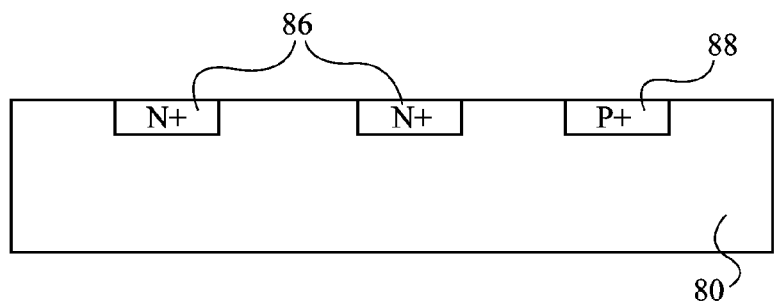

In FIG. 7B, material 80 exhibits heavily-doped N-type areas 86 ($N^+$) and a heavily-doped P-type area 88 ($P^+$). These areas have been obtained by filling depression 82 with N-type powders, and depression 84 with P-type powders, then by sintering these powders. For this purpose, the material may simply be submitted to a thermal processing step.

Figure 7C:
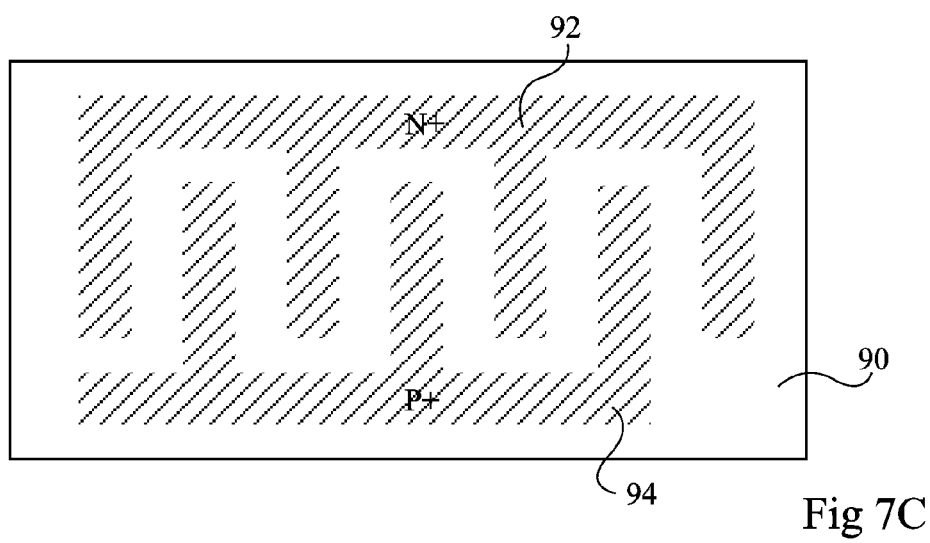

FIG. 7C shows a top view of a semiconductor material 90 according to an aspect of the present invention, in which heavily-doped N-type areas 92 and heavily-doped P-type areas 94 have been obtained according to the method described in relation with FIGS. 7A and 7B. Areas 92 and 94 are interdigited. The surface comprising areas 92 and 94 is intended to be the surface unexposed to light. This makes the forming of a collector comb such as comb 5 of FIG. 1 redundant and correspondingly increases the lit surface of the photocell.

It should be noted that the materials comprising PN junctions described hereabove are components very close to the end product embodied by a photocell. The methods according to the present invention enable further approximating the end product.

Figure 1:
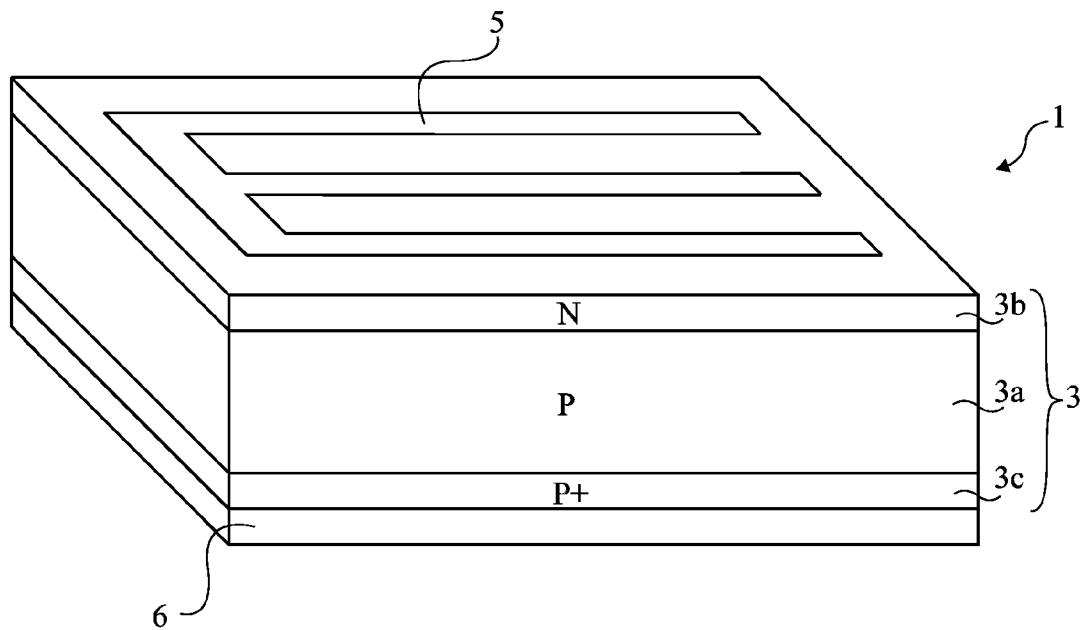
FIG. 1 shows a conventional photovoltaic cell.

On the one hand, when the PN junction is across the thickness of the material, it is possible to place a bed of aluminum powders at the base of the semiconductor powder bed in the material manufacturing. The material obtained after sintering thus includes the lower conductive layer, which no longer needs being deposited afterwards. A heavily-doped P-type area, such as area 3c of FIG. 1, is naturally produced at the contact between the P-type material and the aluminum. A thin layer of heavily-doped P-type powders, for example, from one to a few micrometers, may thus be placed on the layer of aluminum powders on manufacturing of the material. The upper collector comb may also be formed on formation of the material, by placing adequate powders, such as aluminum powders, at the appropriate locations. Transparent conductive ceramic powders may also, for the transmission of current, be placed over the entire surface of the material exposed to light.

On the other hand, when the PN junction is at the surface, as in FIG. 7C, conductive powders may be deposited on the powders intended to form the doped areas (non-lit surface of the material) before their thermal processing. The obtained material thus includes two interdigited conductive areas, which form particularly efficient collectors of the carriers created by photoelectric effect.

A material according to an embodiment of the present invention obtained by sintering of semiconductor powders of different nature will now be described. The used powders may belong to any element of column IV of the Mendeleev table, and/or to their alloys.

Figure 8:
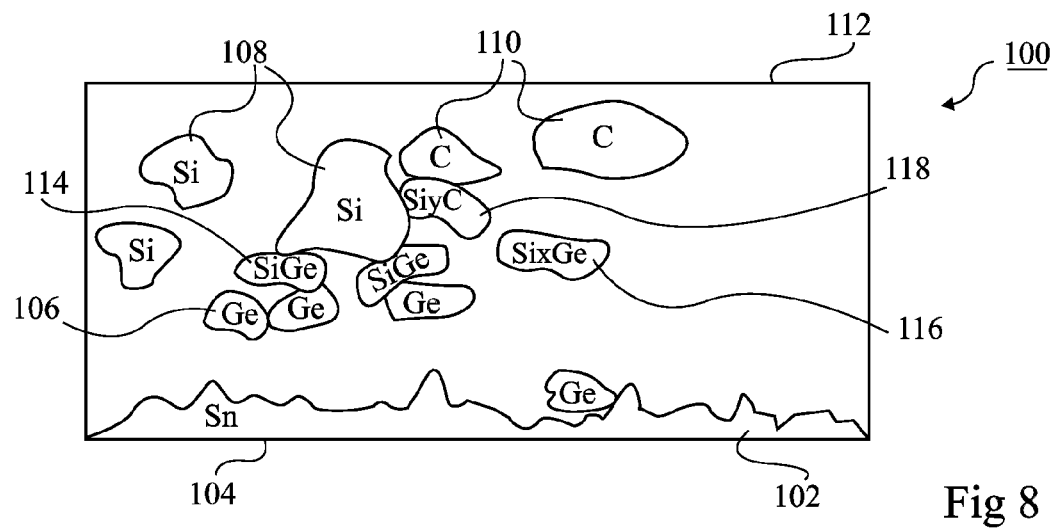
FIGS. 8, 9, and 10 show various exemplary materials according to various embodiments of the present invention.

FIG. 8 schematically shows a top view of a material 100 according to an embodiment of the present invention. Material 100 has been obtained, for example, by application of the method according to the present invention to a bed of powders including powders of tin (Sn), germanium (Ge), silicon (Si), and carbon (C). An area 102 formed of tin runs along edge 104 of material 100. Area 102 results from the sintering of tin powders placed along lateral edge 104. The uneven contour of area 102 may especially be explained by the fact that tin melts at temperatures used in the method and tends to spread into the open porosities of the material. Material 100 also includes islets 106 of germanium (Ge), resulting from the sintering of germanium powders. Similarly, the silicon powders create silicon islets 108 and the carbon powders which, in the shown example, have been deposited rather towards edge 112 of the material, create islets of carbon (C).

Further, material 100 includes islets 114 of SiGe alloy, islets 116 of $Si_xGe$, $Si_xC$ islets 118. The material may also comprise $Ge_xC$ and $Si_xGe_yC$ islets. Such alloys appear at the contact of the grains of different nature in the thermal processing, the various grains aggregating by sintering. If this is desired, the forming of these alloys may be limited by placing the powders of different nature so that they avoid mixing too much. Powders of various alloys may also be arranged in the bed of powders to be sintered, to increase the proportion of the alloys. Further, the used powders or the obtained materials may be doped as described hereabove.

It should be noted that with conventional methods for manufacturing semiconductor materials, such as methods using melts, only homogenous alloys may be obtained and a "composite" material such as material 100 cannot be obtained.

Material 100 is particularly advantageous in photovoltaic applications.

Indeed, the wavelength of the radiations absorbed by a semiconductor element depends on the value of the energy gap of this element. Thus, silicon, having an energy gap of 1.1 eV, is naturally optimized for visible light. Infrared radiations are practically not absorbed by silicon. Ultraviolet radiations are rapidly absorbed by silicon, but the excess energy represented by the difference between the energy of the radiation and the value of the energy gap is lost. Germanium, having a 0.7-eV energy gap, is particularly well adapted to absorb infrared light. An alloy of $Si_xGe$ type has an energy gap ranging between the energy gap of silicon and that of germanium. An $Si_xC$-type alloy has a much greater energy gap than that of silicon. An alloy of this type responds particularly well to blue and ultraviolet radiations.

As a result, material 100 has a locally variable energy gap. This is an extremely significant advantage, since the radiations may be used at best in a photovoltaic application. For example, material 100 may respond to the practically entire solar spectrum, which is not the case for a conventional silicon photocell.

Figure 9:
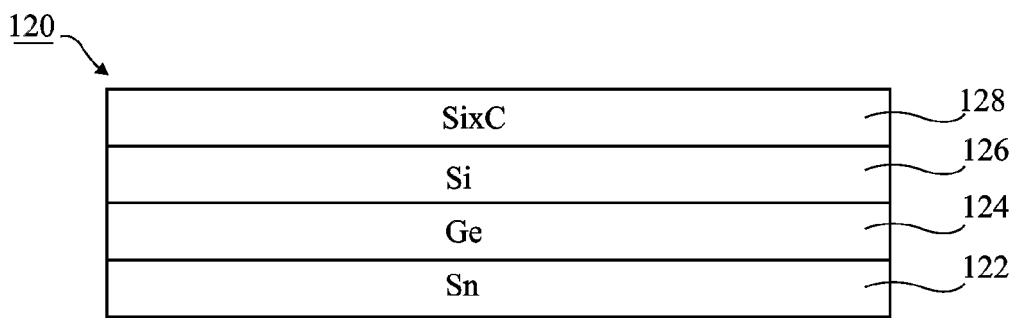

FIG. 9 schematically shows a bed of powders 120 intended for the forming of a material according to an embodiment of the present invention. Powder bed 120 includes a lower layer 122 of tin powders, followed by a layer 124 of germanium powders, followed by a layer 126 of silicon powders, the assembly being topped with a layer 128 of powders of a carbon and silicon alloy $Si_xC$. The layers of powders 122, 124, 126, and 128 are arranged by increasing energy gap order.

After sintering, the obtained semiconductor material thus includes several superposed layers of materials of different energy gaps. In a photovoltaic application, the surface of the material comprising the layer with the larger energy gap, $Si_xC$, is exposed to light. Alloy layer $Si_xC$ absorbs the ultraviolet radiation and around and lets through visible and infrared radiations. The silicon layer absorbs the visible light and is practically transparent to infrared radiations, which are absorbed by the germanium layer. Various alloys created during the sintering help the absorption of the radiation. The tin layer, buried, is mainly used to collect the carriers created by the photovoltaic effect. As previously, a PN junction may be formed by an appropriate doping.

As compared with the material of FIG. 8, the material obtained by the powder bed of FIG. 9 is advantageous in that the radiations successively cross layers of decreasing energy gaps. This enables more complete absorption of the radiation.

Of course, the present invention is not limited to the described examples and any variation, modification, or the like within the abilities of those skilled in the art belongs to the field of the present invention.

In particular, the plates used to compress the powder bed are not necessarily planar and may have any shape.

Figure 10:
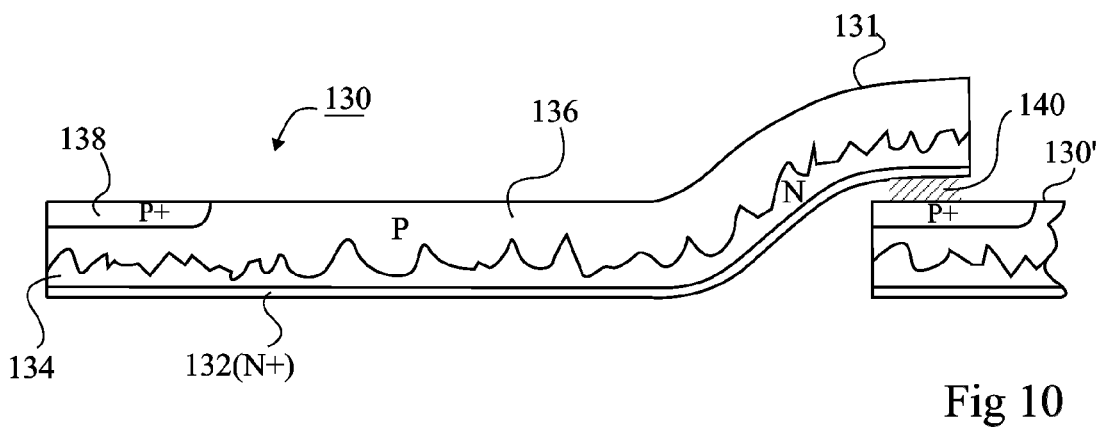

FIG. 10 thus shows a tile-shaped semiconductor material 130 that may integrate to the structure of a roof. Material 130, which will be called tile hereafter, includes a non-planar end 131 enabling covering the next tile 130' and connecting thereto. Tile 130 is obtained by sintering of a bed of semiconductor powders by means of plates of corresponding shape. The powder bed has been formed to successively create a thin heavily-doped N-type layer 132 ($N^+$), an N-type doped layer 134, followed by a P-type doped layer 136. At the end opposite to end 131 is a heavily-doped P-type area of small extension 138 ($P^+$). Tile 130 is connected to tile 130' by any conductive attachment means 140, such as a welding or a flexible wire, connecting the $N^+$ layer of a tile to the $P^+$ area of the next tile. The photocells formed by tiles 130 and 130' are thus series-connected. Various other ways of grouping a set of tiles, in series and/or in parallel, provide the desired features of an installation.

It should be noted that, for the melting step, any appropriate means, such as resistive furnaces, lamp furnaces, solar furnaces, etc. may be used, the power being transferred by conduction, convection, radiation, etc.

It should also be noted that any structure or component including one or several materials according to the present invention belongs to the scope of the present invention.

It should also be noted that the materials according to the present invention are not limited to the materials obtained by the exemplary methods according to the present invention. For example, any semiconductor material comprising grains and/or aggregates exhibiting different energy gaps belongs to the scope of the present invention, whatever its obtaining mode.

Some further embodiments or aspects of the present invention will now be described in relation to FIGS. 11 and 12.

According to the following aspect of the present invention, the materials or wafers produced by an exemplary method of the present invention may be purified during their production steps. This aspect of the present invention is particularly useful if the powders used to form the sintered material are not very pure.

The inventor has found that it was possible to purify a porous semiconductor material using a gas flow through the material. At least two factors explain the good results in purification. First, the gas flows through the porosity channels of the material, and reaches great parts of the inner volume of the material. Second, due to diffusion, impurities inside the material reach the porosity channels and may be evacuated out of the material by the gas flow. As this will be seen later, the gas which is used for the purification may be a non reactive gas, or a gas which reacts with impurities of the material. In the latter case, impurities may form, with the gas or other atoms or molecules present or formed in the material, volatile components which are carried out of the material by the gas flow. The purification of the material may be performed during the production of the material, that is, during the sintering of the powders, or after the production of the material. The materials purified according to the present invention may be used in the photovoltaic, electronic, or microelectronic field.

The purification of the material allows the use of powders which are not very pure. For example, the powders may derive from parts of single-crystal or polycrystalline silicon ingots which are not sufficiently pure, like head, tail and edges of the ingots. The source material may also be damaged wafers or wafers with defects, at any stage of the fabrication of photovoltaic cells, electronic components or integrated circuits. If the source material is already doped, the purification according to the present invention allows also the production of purified material. Silicon used in metallurgy may also be used in the present invention. For example, silicon including one or some percent of iron may be purified by the present invention.

The source material may, of course, include all or several of the elements mentioned above. If the source material is not already present in the form of powders, an exemplary method of the present invention provides a grinding step for providing powders from the source material. The powders may be of various sizes, but a size less than 10 micrometers may be preferred.

The production of purified wafers according to an aspect of the present invention will now be described in relation with FIGS. 11 and 12.

Figure 11:
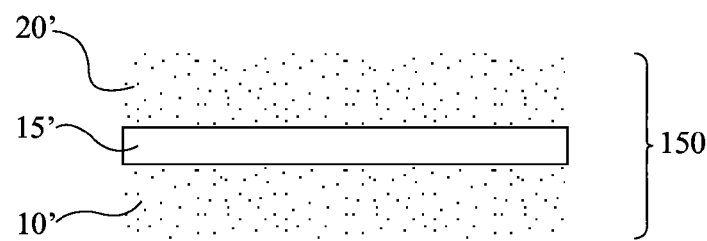
FIG. 11 shows an exemplary assembly used by an exemplary method of the present invention.

FIG. 11 shows in cross-section an assembly 150 including a lower plate 10', a bed of semiconductor powders 15', for example silicon powders, and an upper plate 20' which covers powders 15'. The assembly 150 is similar to the assembly shown in FIG. 2, except that lower plate 10' and upper plate 20' are made of a porous material, for example a porous ceramic or graphite, allowing the passage of a gas.

The powders of bed 15', like the powders 15 of FIG. 2, for example are powders of pure silicon or silicon enriched in elements from column IV of the Mendeleev table, such as carbon, germanium, tin, or their alloys. Powders of other semiconductors may also be used, and germanium and gallium arsenide (GaAs) materials may be formed by sintering.

The powders may be of nanometric, micrometric, or even millimetric size. Preferably, the size of the powders is smaller than the thickness of the material which is desired to be obtained. However, it may also be slightly greater, the powders being crushed during sintering. A mixture of powders of various granulometries may also be performed to form powder bed 15', especially to conveniently and efficiently control the general porosity or that of areas of the obtained material. Powder bed 15' may be formed like powder bed 15 of FIG. 2.

Figure 12:
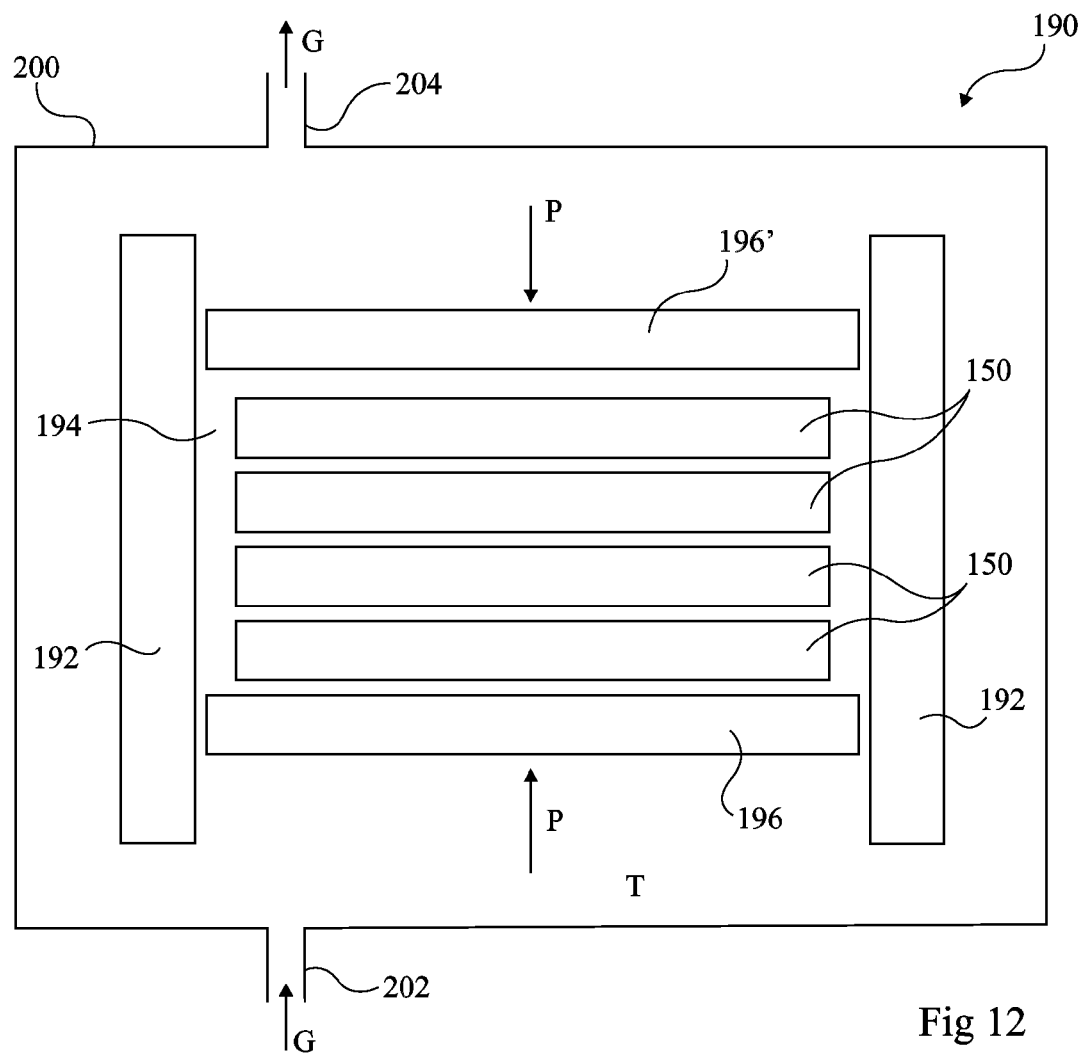
FIG. 12 shows a device used for producing materials according to an embodiment of the present invention.

FIG. 12 shows a reactor 190 performing the production and the purification of wafers according to the present invention.

In FIG. 12, reactor 190 includes a matrix 192 forming a chamber 194. A lower plate 196 and an upper plate 196' close chamber 194. Plates 196 and 196' are made of a porous material. Matrix 192 may also be made of a porous material, but it is not necessary. Matrix 192 and plates 196, 196' are disposed in an enclosure 200 having at least an input opening 202 for inputting a gas G and a gas output opening 204.

Several assemblies like assembly 150 of FIG. 11 may be arranged in chamber 194, so as to produce a lot of wafers simultaneously.

To produce the wafer, a pressure P is exerted between plates 196 and 196'. A pressure P ensures a compacting of the silicon powders 15', plates 10' and 20' compressing the powders.

Reactor chamber 194 is then submitted to a thermal processing at a temperature T, in order to provide a sintering of the wafers. The thermal processing may be applied, as already explained, during or after the compacting of the powders. The pressure exerted in the compression step may vary within a wide range of values, for example, from 10 bars (1 megapascals) to 10,000 bars (1 gigapascal). The temperature used in the thermal processing step may also vary within a wide range of values. For example, it may be comprised between 800 and 1400° C. for silicon.

As already mentioned, the purification step may be performed during one of the formation steps of the material. Of course, the purification steps take place before the liquid phase occurs if a liquid phase is needed. If this was not the case, the liquid phase would close a lot of porosity channels, and the gas would be unable to flow through the material for purifying it.

Some of the possible operating modes will now be described.

For example, it is possible to perform a hot pressing step of the powders while a purification due to gas flow takes place.

Also, a hot pressing step may be performed in order to form the material. Then, the purification step may take place, in the same enclosure as the enclosure used for the hot pressing step, or in a separate enclosure.

Also, a cold pressing step may be first performed. Then, the thermal processing and the purification step may be performed together, or separately.

In all the cases, when needed, the steps producing a liquid phase in the material take place after purification.

Characteristics of the purification step or steps will now be described.

Gas enters enclosure 200 via opening 202. Then, the gas enters chamber 194 through porous plates 196, 196', and matrix 192 if matrix 192 is porous. The gas passes then through the assemblies 150 of chamber 194, via plate 10', the porosity channels of the material which is being formed, and plate 20'.

Instead of being made of porous material, one or more elements among plates 196, 196', matrix 192, plate 10', and plate 20' may be made of a non porous material pierced with small traversing openings allowing the gas to pass. For example, these opening may be small conducts with a diameter of 0.1 to 1 millimeter.

The purification step, using a gas flow, may be performed at various times during the formation of the wafers. For example, it may be performed at the first stages of powder compaction. It may be performed also at one of the last stages of the sintering of the material. It is just necessary that the porosity of the material remains an open porosity, that is that the porosity channels within the material are interconnected and lead to the outside the material.

The material is more rapidly purified if the temperature is high, because impurities have a better mobility and may reach more easily the porosity channels. For example the temperature may be between 800° C. and the melting temperature of the material. It is advantageous to purify the material during the or one of the thermal processing steps of the sintering process.

Various durations may be used for the purification step. For example, the duration of the purification step may be of about half an hour to one hour after chamber 194 has reached the desired temperature, the duration of which may also be in the order of about half an hour to one hour. The duration of the purification process depends on various factors. For example, if powders have a small size, the porosity channels are close one to the other and impurities reach quickly the porosity channels, whereby the material is purified faster.

Various gas pressures may be used, and the gas pressure may be changed during the purification step.

If the gas pressure is more than one atmosphere, a gas flow occurs naturally between opening 202 and opening 204.

If the gas pressure is less than one atmosphere, the pressure in chamber 194 is a low pressure, for example ranging from 1 to 10 hectopascals. In this case, the gas is pumped at opening 204, for creating the gas flow and evacuating the gas at the outside.

Various sorts of gas may be used.

For example, the gas may be a non reactive gas, like argon. When a non reactive gas flows through the porosity channels of the material, impurities which are not or only weakly linked to the walls of the porosity channels may be detached and carried out of the material by the gas flow. Further, due to diffusion, impurities inside the material but not present in a porosity channel may reach a porosity channel and be evacuated.

Preferably, the gas is at least partly a reactive gas which chemically reacts with a particular type of impurities to provide volatile components at the temperatures which are utilized. These volatile components are evacuated outside the material by the gas flow. The gas may also be a mixture of a carrier gas, like argon, and at least one reactive gas.

The type of the reactive gas depends on the type of impurities to be eliminated.

Examples of very polluting impurities of silicon, which are very difficult to eliminate at low cost, are the metallic impurities. These metallic impurities may include titanium (Ti), tungsten (W), molybdenum (Mo), iron (Fe), chromium (Cr) or copper (Cu). It has been found that a flow of a gas containing chlorine, like chlorine ($Cl_2$) or hydrochloric gas (HCl), in the porosity channels of the material, reacts with the atoms of titanium present in the material to form a volatile component, $TiCl_4$, carried away and evacuated by the gas flow. Atoms of titanium not present in or at the surface of porosity channels may reach a porosity channel due to diffusion, and are then likely to react with the gas. As a result, the purification process of the present invention provides a material without titanium, as all the inner volume of the material may be reached by the porosity channels. A gas containing chlorine may eliminate other impurities than titanium, as the majority of metals, like iron or copper, also reacts with chlorine. A gas containing fluorine like $CF_4$, $SF_6$ or $CCl_{12}F_2$, or containing bromine like HBr may also be used. To eliminate tungsten, a gas containing fluorine may be used, as tungsten forms with fluorine a volatile component, $WF_6$, carried out of the material by the gas flow. Molybdenum reacts with $CF_4$ to form a volatile component, $MoF_6$, which may be evacuated.

Other kinds of impurities may include non metallic impurities like oxygen and carbon. Oxygen is mostly present as the oxide which is naturally present at the surface of the powder particles. A gas containing hydrogen reduces oxides, which are evacuated outside the material. The gas which is used may be the hydrogen gas ($H_2$), or a gas containing hydrogen, like the hydrochloric gas (HCl) or the ammoniac gas ($NH_3$). Carbon may also be evacuated by gases containing hydrogen because carbon provides volatile hydrocarbons, like methane ($CH_4$), depending on the conditions in chamber 94, for example a temperature of about 1000° C. with a mixture of gases containing argon and about 10% of hydrogen $H_2$.

Regarding alkaline-earth impurities, like sodium, calcium, magnesium or manganese, it has been observed that, at the temperatures used, these impurities are greatly evacuated using a mere pumping, without injecting a gas. The injection of a non reactive gas helps in eliminating these impurities. Further, if a gas containing chlorine is used for eliminating other impurities, chlorine also eliminates alkaline-earth impurities, like sodium and calcium.

Doping elements may be also suppressed by the method of the present invention. Indeed, phosphorus, boron, arsenide, gallium, and aluminum may provide volatile complexes with hydrogen, chlorine and/or carbon. For example, an atom of boron may be combined with an atom of hydrogen and a SiO particle to form an atom of silicon and a molecule of HBO, which may be evacuated. Boron may also be evacuated using water-vapor. Some doping elements may also be evacuated by the gas flow merely when temperature is high.

It should be noted that the gas which is used may be a mixture of gases, if the gases are compatible at the used temperatures. For example, it is possible to use a gas mixture comprising 95% of argon (Ar), 4% of hydrogen ($H_2$) and 1% of chlorine ($Cl_2$). If incompatible gases should be used, they may be used the one after the other.

It should also be noted that the present invention allows a selective cleaning of impurities, depending on the conditions and on the nature of the gas. Thus, silicon powder with for example 10 ppm of boron and 10 ppm of phosphorus may be purified from one of the doping elements to become a doped material of the N or P type. Phosphorus may be easily eliminated at temperatures above 1200° C. due to its vaporization. To eliminate boron, a part of water-vapor in argon at a temperature ranging between about 700 to 900° C. may be used to produce the volatile molecule HBO.

Further, pumping may be advantageous. Indeed, a component to be eliminated may have a saturating vapor pressure and be in equilibrium with its vapor in a porosity channel of the material. Continuously pumping in this case decreases the vapor pressure and the component to be eliminated produces more vapor, which may accelerate the speed of the process for eliminating this component.

Of course, as already mentioned, the present invention is likely to have various alterations and modifications which will occur to those skilled in the art.

In particular, it should be noted that every step of the purification and/or formation of the material may be split into a plurality of steps.

Also, the method of the present invention may provide other materials than semiconductor materials, and the purification steps of the present invention may be applied to any porous material.

Also, when the present invention is applied to elaborate materials for the photovoltaic, electronic or microelectronic field, the powders which are used are not necessarily powders of a unique semiconductor. For example, the powders may be powders of silicon mixed with powders of any other element of column IV of the Mendeleev table, like Germanium (Ge). The powders may also be semiconductor powders mixed to powders of non semiconductor materials, like silica $SiO_2$.

Some further embodiments or aspects of the present invention will now be described in relation to FIGS. 13 to 16.

Figure 13:
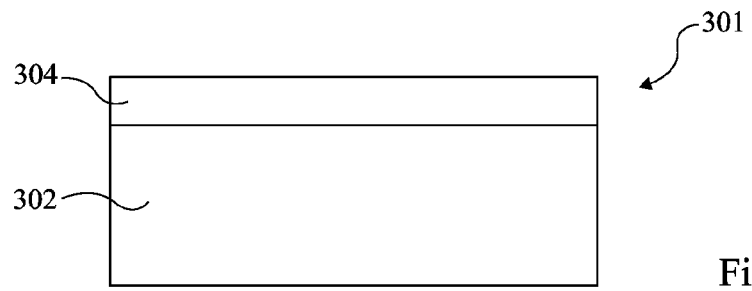
FIG. 13 shows an exemplary material according to another embodiment of the present invention.

Structure 301 of FIG. 13 includes a support layer 302 and an upper layer 304 lying on support 302.

Support 302 is formed of a silicon wafer obtained by sintering silicon powders. This sintered silicon wafer is obtained by compressing and thermally processing silicon powders. Examples for providing the sintered silicon wafer are described above.

Support 302 preferably includes relatively small silicon grains and is porous. The thickness of support 302 may vary in a broad range of values. Preferably, the thickness of support 302 is greater than 50 micrometers, for example, between 200 and 500 micrometers. It should be noted that, due to the low cost of sintered silicon wafers, support 302 may be relatively thick, for example, one to several millimeters, which provides robust wafers without substantially increasing the costs. This provides a great advantage in the photovoltaic field. Indeed, in the prior art, wafers are very thin for costs reasons, and a lot of wafers brake during the fabrication of photovoltaic cells.

Layer 304 is a single-crystal silicon layer. The thickness of layer 304 may be in a broad range of values. The thickness of layer 304 is typically in the order of 30 to 50 micrometers if structure 301 is intended to be used in the photovoltaic field, and typically in the order of one micrometer in others applications, such as in microelectronics. Layer 304 is intended to be the active layer of structure 301. Layer 304 may be obtained by gluing after removal, as will be now described in relation to FIGS. 14A to 14D.

Figure 14A:
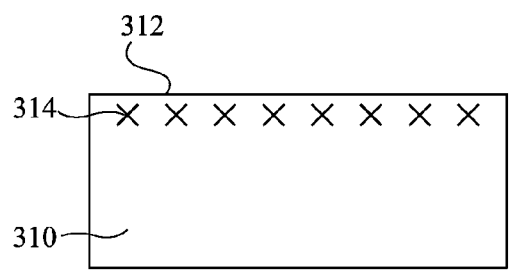
FIGS. 14A, 14B, 14C and 14D show an exemplary process according to an aspect of the present invention.

Reference 310 in FIG. 14A represents a thick single-crystal silicon plate. Plate 310 has, for example, a thickness of one millimeter and is intended to provide layer 304 of structure 301. There is a default zone 314 near the upper surface 312 of plate 310. Default zone 314 may, for example, be provided by a chemical treatment which renders surface 312 porous while keeping the single-crystal structure of plate 310.

Figure 14B:
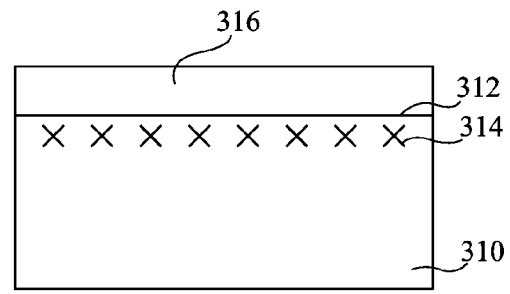

Then, as shown in FIG. 14B, an epitaxial layer 316 of single-crystal silicon is provided. Layer 316 is intended to form active layer 304 of structure 301 and its thickness depends on the desired application.

Figure 14C:
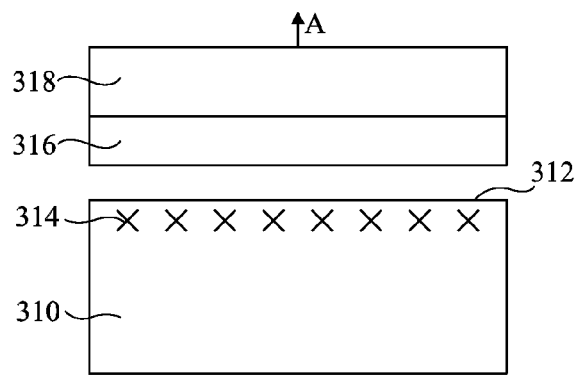

In FIG. 14C, epitaxial layer 316 is removed from plate 310. For example, a plate 318 of glass or plastic is glued on layer 316 and a force A is applied on plate 318 in a direction which may or may not be perpendicular to surface 312. Due to default zone 314, layer 316 is separated easily from plate 310. Other techniques, such as ultrasonic or pressurized water jet removal may be used to remove layer 316.

Figure 14D:
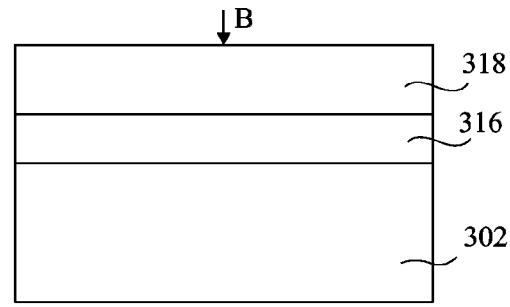

In FIG. 14D, the combination formed by layer 316 and plate 318 is placed onto support 302 and a pressure B may be applied to make gluing easier, the gluing being performed by molecular gluing. Upper surface of support 302 as well as lower surface of layer 316 may have been processed prior to gluing, for example, using etching or polishing, to make gluing easier. If this is desired, a thermal processing with or without compression may be performed, so that glued surfaces have a better mechanical strength. Then, plate 318 is removed and the combination of support 302 and layer 316 forms structure 301 of FIG. 13.

Structure 301 is thus formed of a sintered silicon wafer 302 and an active single-crystal silicon layer 304. Various dopings and/or connection elements may then be implemented in or on active layer 304 to provide a desired device, such as one or several integrated circuits, one or several electronic components, one or several photovoltaic cells, etc.

The fact that the support of the active layer is made of sintered silicon may have significant advantages.

The support and the active layer being both of silicon, they have similar physical and chemical properties. A consequence is that the various fabrication steps of the desired device may be performed without the occurrence of particular problems, such as problems due to a bad temperature behavior of the support, problems due to thermal expansion differences between support and active layer, etc.

Further, the surface of the sintered silicon wafer is naturally relatively rough and allows, if necessary, a later removal of the active layer. This allows for example, once the desired device has been fabricated, the removal of the active layer and the transfer thereof on another support which, due to its physical and/or chemical properties, would not have permitted the desired device to be fabricated.

It should be noted too that, when sintering the silicon powders to provide support 302, doping elements may be mixed with the powders in order to dope the wafer. For example, a high doping with boron renders support 302 conductive, which allows a rear electrode in structure 301 to be provided.

Further, the control of the sintering of silicon powders allows a sintered wafer having a determined porosity, in which the porosity channels are interconnected and reach the outside. The porosity channels may be used to introduce elements inside the support wafer. For example, if the wafer has not yet been doped, doping elements may be introduced deeply into the wafer structure. The porosity channels may also be filled with a conductive material, for example using an aluminum paste which is spread on the underside of layer 302 and melted. The porosity channels may also be used to establish a connection between the bottom of the active layer and the outside, without the need of providing a connection on the upper surface of the active layer. This may be a significant advantage if the desired device is a photovoltaic cell, because the upper surface of the active layer, which is exposed to the sun, is larger and the conversion of the cell is increased.

Among other advantages provided by a sintered silicon support, it should be noted that the support wafer may have any form and may be of a small or large size, depending on what is needed. Also, the desired form and size of the wafer may be obtained directly when fabricating the wafer, for example, by placing the powders in an appropriate mould. Also, the wafer is not necessarily flat. The surface of the silicon wafer may be curved and have, for example, the form of a tile adapted to the roof of an existing building. This is an advantage for photovoltaic cells.

Figure 15:
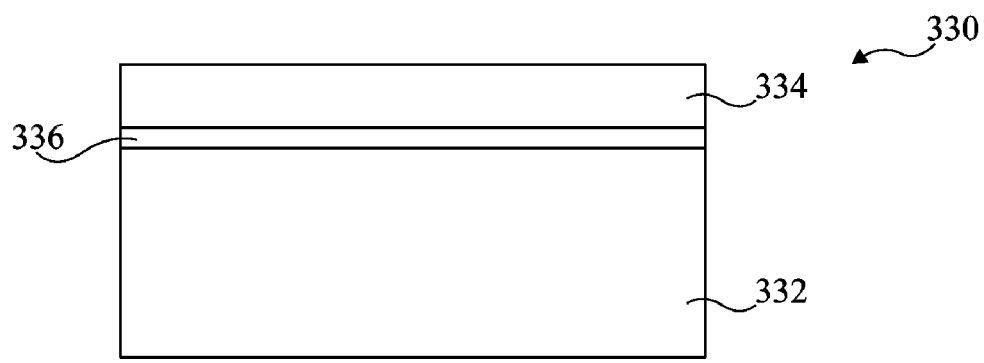
FIG. 15 shows an exemplary material according to another embodiment of the present invention.

FIG. 15 shows another structure according to an embodiment of the present invention.

In FIG. 15, a structure 330 includes a lower layer 332 forming a support, an upper layer 334 and an intermediate layer 336. The lower layer 332 is formed of a sintered silicon layer, like support 302 of FIG. 13 and its thickness is similar. Intermediate layer 336 is a thin layer forming a diffusion barrier. Layer 336 may, for example, be a layer of silicon oxide (silica) ($SiO_2$), of silicon nitride ($Si_3N_4$), or of silicon carbide (SiC). The thickness of layer 336 is very thin, typically less than 10 nanometers. Upper layer 334 is a single-crystal silicon layer, which may have been moved onto layer 336 using the method of FIGS. 14A-14D. Layer 334 is intended to be an active layer. A typical thickness of layer 334 is, for example, in the order of one or a few micrometers for microelectronic applications and from 30 to 50 micrometers for photovoltaic applications.

The thin layer 336 provides advantages because layer 336 acts as a diffusion barrier and may block impurities contained in lower layer 332. This allows the use of impure silicon powders to form support wafer 332.

Structure 330 also has the advantages of structure 301 of FIG. 13 (possibility of large wafers, non-planar wafers, and advantages linked to a silicon support). It is also possible to use the porosity channels of the support wafer to introduce dopants or a conductive material providing an electric contact with the lower part of the active layer. Indeed, although formed of a material that is usually considered as an insulating material (silica, silicon nitride, silicon carbide), layer 336 is very thin and conduction mechanisms such as tunnel injection or injection of charges through defects enable layer 336 to conduct electrical current. It should be further noted that the presence of the thin layer 336 may allow a better molecular gluing of the active layer.

Figure 16:
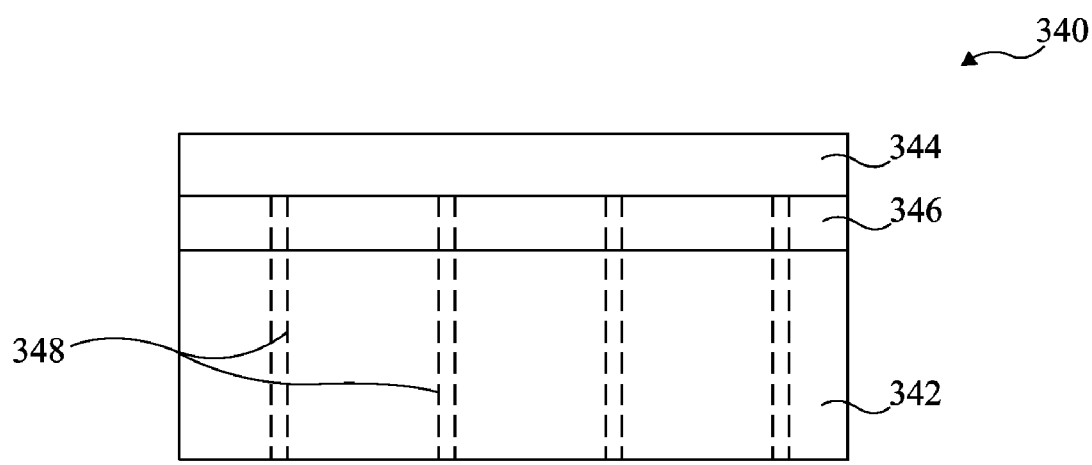
FIG. 16 shows an exemplary material according to yet another embodiment of the present invention.

FIG. 16 shows another structure according to an embodiment of the present invention.

In FIG. 16, a structure 340 includes a lower layer 342 forming a support, an upper layer 344 and an intermediate layer 346. The lower layer 342 is formed by a sintered silicon wafer. Upper layer 344 is a single-crystal silicon layer. Intermediate layer 346 is a thick insulating layer. Insulating layer 346 may be made of silica ($SiO_2$), silicon nitride ($Si_3N_4$), or silicon carbide (SiC).

The thickness of the lower layer 342 may be in the same order as lower layer 332 of FIG. 15, typically greater than 50 micrometers. It may also be thicker, for example a few millimeters, because its fabrication cost is low. The thickness of upper active layer 344 depends on the use of structure 340. Thus, a thickness of 30 to 50 micrometers for layer 344 is adequate for a use in the photovoltaic field. The thickness of insulating layer 346, which is not critical, is typically in the order of 100 nanometers to a few micrometers. It should be noted that a thickness greater than 10 nanometers is sufficient to render layer 346 insulating.

Insulating layer 346 provides a very efficient barrier to impurities. Thus, very impure silicon powders, for example metallurgical silicon powders, may be used to make support 342, without contamination of the active layer by impurities of the support.

It should be noted that, as support 342 is electrically insulated from active layer 344, structure 340 may be used as a so-called "SOI" (Silicon On Insulator) structure for all the applications where structures of the SOI type may be used. An advantage of structure 340 is that it is much less expensive than conventional SOI structures, in which the active layer is on a single-crystal silicon substrate.

Generally, as support 342 is electrically insulated from active layer 344, all the electrical contacts should be provided on the front face of the device, that is on the upper surface of the active layer. However, it should be noted, that it is also possible to provide electrical contacts on the rear face, as in the case of structure 330 of FIG. 15. In that case, a plurality of holes 348, shown by dotted lines in FIG. 16, may be provided. Holes 348 are, for example, created with a laser beam from the rear of the structure and stopped when they have passed through insulating layer 346. Holes 348 are then metallized to provide electrical contacts. The diameter of holes 348 may be in the order of one to a few tens of micrometers.

Of course, the present invention is not limited to the examples described in relation to FIGS. 13-16, and any variation, modification, or the like will be within the abilities of those skilled in the art.

In particular, the thicknesses of the described layers are just indicative and may be modified to a great extend.

Also, the sizes or forms of the wafers have not been described in detail and may be of various types. For example, to make photovoltaic cells, the wafers may be squares having edges of 15 cm.

Also, layers 336 and 346, which are shown between support layer and active layer in the figures, may completely surround the support layer on all sides, in which case the man skilled in the art will know to provide the necessary arrangements if electrical contacts have to be present at the rear of the structure.

Also, holes 348 of FIG. 16 may also be present in support wafer 302 of FIG. 13 or in support wafer 332 of FIG. 15. These holes will be in any case used if it is desired to have access to the active layer from the rear face of the structure and if the support wafer has been formed without open porosity, that is if the porosity channels are not interconnected and do not open to the outside.

The present invention may be applied in the photovoltaic field, in all the fields in which a structure of the SOI type may be used, as well as in optics, optoelectronics, electronics, and microelectronics. For example, the present invention may be used for the fabrication of discrete electronic components, electronic chips, microprocessors, CPUs, electronic chip supports, and in 3D integration.

Some further embodiments or aspects of the present invention will now be described in relation to FIGS. 17 to 27.

For clarity, the same elements may have been designated with the same reference numerals in the different drawings and, further, as usual in patent applications, the various drawings are not to scale.

Figure 17:
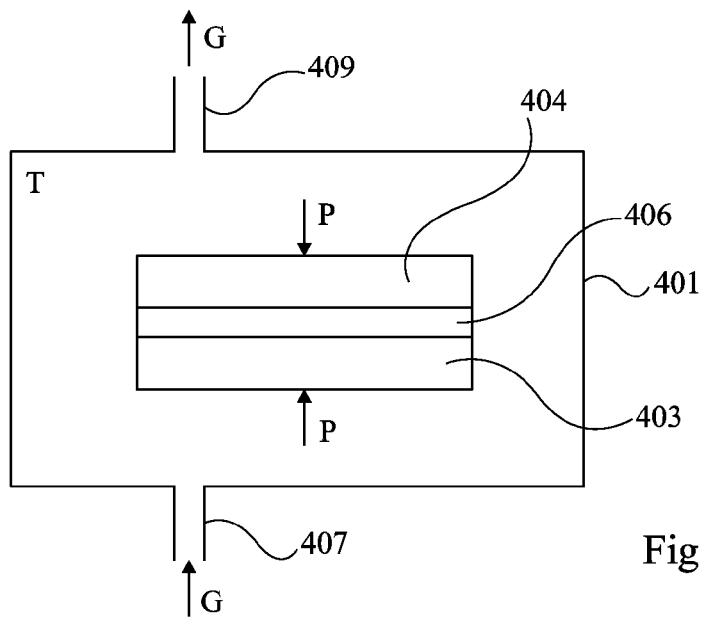
FIGS. 17 to 22 illustrate an exemplary method for forming electronic structures according to an aspect of the present invention.

In FIG. 17, an enclosure 401 encloses a lower plunger 403 and an upper plunger 404. Silicon powders 406 have been placed between the lower and upper plungers. Enclosure 401 has a gas inlet opening 407 and a gas outlet opening 409.

A gas flow G is established between openings 407 and 409. Enclosure 401 is brought to a temperature T. A pressure P is applied between plungers 403 and 404. Silicon powders 406 are sintered and transformed into a rigid sintered silicon wafer.

There may be a great variety of sintering conditions.

For example, the size of powders 406 is not critical. For example, the powder granulometry may range between 10 nanometers and 100 micrometers. A mixture of powders of different granulometry may be made, like nanometric powders and micrometric powders.

The quality of the powders is not critical either. As will be seen hereafter, solar grade or electronic grade silicon powders may be used. So-called metallurgical grade or MG powders or so-called upgraded metallurgical silicon or u-MG powders may also be used.

Temperature T may range between 1,000 and 1,400° C. Pressure P may range between 5 and 100 megapascals. Temperature T and pressure P may be applied jointly, during one or several hot compression steps, or successively, during one or several compression steps followed by a thermal processing. Temperature T and/or pressure P are not necessarily fixed during the sintering.

The pressure of gas G may, for example, vary between a few hectopascals and more or less 1,000 hectopascals. Gas G may be argon. Hydrogen may be added thereto to reduce the oxygen present in the powders, together with another gas, for example, a halogenated gas, to purify the powders. Various gases and operating modes for purifying a sintered wafer after it has been formed or during its forming have been described in the foregoing and may be used. For example, plungers 403 and 404 may be porous to let the gas flow through the porosity channels of the material which is being sintered. The purification may be performed during the first phases of sintering the material, for example when the wafer is compacted and preheated, before one or several hot pressing steps.

The gas flow may be sustained or not during the entire sintering. It should further be noted that the presence of a gas flow is not essential and that the sintered wafers may be manufactured with no gas flow. In such a case, enclosure 401 does not necessarily include openings 407 and 409. FIG. 17 illustrates only a non limiting example of an apparatus for making a sintered wafer.

Figure 18:
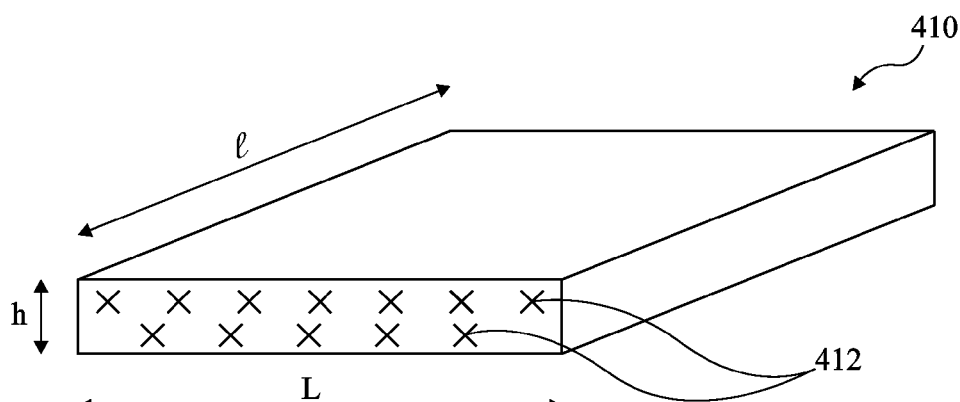

FIG. 18 shows a sintered silicon wafer 410, obtained after sintering.

Wafer 410 has a length L, a width l, and a thickness h. For example, square wafers having a side of 150-millimeter and having a thickness h ranging between 100 and 500 micrometers may be formed. Circular, diamond-shaped, or hexagonal wafers may also be formed, since the wafers may have any shape, however preferably tileable. Wafer 410 is not necessarily planar either, but may be adapted to a desired shape, for example to the shape of a roof tile. Wafer 410 is formed of small grains 412, symbolized by crosses in FIG. 18. Generally, the sintering does not increase the grain size much. For example, if powders with dimensions on the order of one micrometer are used, grains 412 will have a size that may range from 1 to 3 micrometers according to the sintering conditions.

Wafer 410 may be made in non-porous or porous form, with a porosity that may be controlled by the wafer manufacturing conditions.

Further, wafer 410 is generally N-type and/or P-type doped, types N+ and/or P+ being preferred. Types P+ and N+ should be understood as corresponding to dopant concentrations greater than $10^{18}$ atoms/cm$^3$, for example, ranging between $10^{18}$ and $10^{21}$ atoms/cm$^3$, and types P or N should be understood as corresponding to dopant concentrations smaller than or equal to $10^{18}$ atoms/cm$^3$, for example, ranging between $10^{15}$ and $10^{18}$ atoms/cm$^3$. The doping may be performed during the sintering. For example, previously-doped powders may be used, or dopants may be mixed to the silicon powders or provided by gas G which flows in the porosity channels. In the case of porous wafers, the doping may also be performed after the sintering, that is, after the forming of wafer 410. For example, the dopants may be introduced by injecting a gas, a liquid or viscous product which penetrates into wafer 410 via the porosity channels. A paste containing dopants may also be applied on one or both surfaces of the wafer, to have the dopants penetrate by diffusion. The dopants may be added in one or several steps. The doping may be homogeneous, exhibit a gradient, or be local, that is, present in one or several different portions of the wafer.

Figure 19:
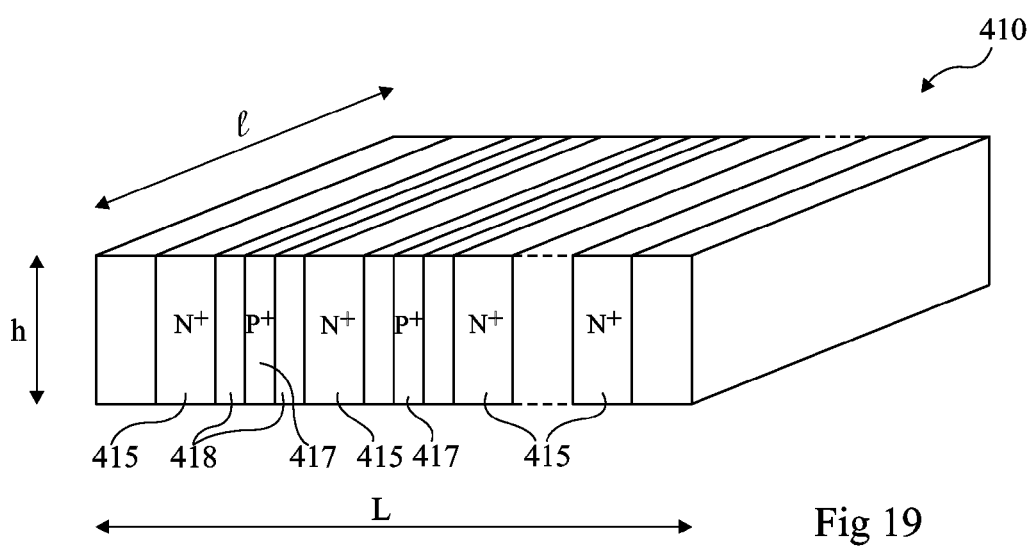

FIG. 19 shows an example of a wafer 410 with a local doping.

In FIG. 19, wafer 410 has N+-type doped areas 415 alternating with P+-type doped areas 417. Areas 415 and areas 417 appear in the form of strips taking up the entire width l and the entire height h of wafer 410. For example, the width of areas 415 is on the order of 2 millimeters and the width of areas 17 is on the order of 1 millimeter. The doping of areas 415 and 417 is performed after the manufacturing of wafer 410, which here has been made in porous form. The dopings may, for example, be performed by injecting liquid or a viscous product into the wafer pores. Areas 415 and 417 may thus be formed by serigraphy, followed by an anneal step for diffusing the dopants.

Areas 418 are located between areas 415 and 417. Areas 418, for example, having a width on the order of one millimeter, may enclose an insulator, such as silica $SiO_2$. The insulator may have been introduced by a method similar to that used for the doping, for example, by applying a paste containing silica on the corresponding portions of the wafer surfaces and by having said paste penetrate through the porosities.

The injection of an insulator into areas 418 is not necessary. There may, for example, be no such injection if wafer 410 has been made from undoped or lightly-doped solar or electronic grade powders, since such powders, once sintered, have a much smaller resistivity than the N+ or P+ doped areas. However, the injection of an insulator into areas 418 is recommended if the powders used are MG or u-MG powders. Indeed, in this case, the metallurgic silicon risks being conductive and creating disturbing leakage currents.

Of course, FIG. 19 is an example of local doping only, and patterns other than strips may be designed for areas 415 and 417.

Once wafer 410 has been made and doped, a surface of wafer 410 may be recrystallized, as will be described in relation with FIG. 20.

Figure 20:
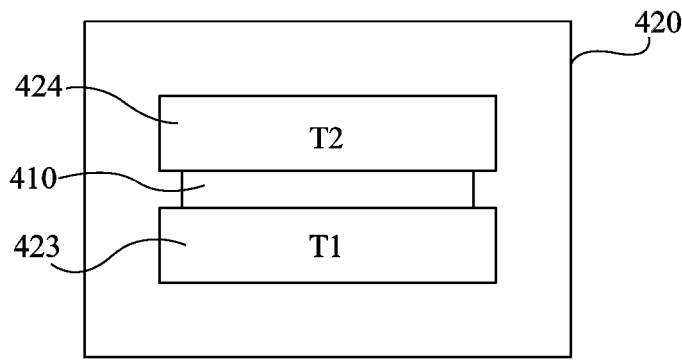

In FIG. 20, an enclosure 420 encloses a lower counter-plunger 423 and an upper counter-plunger 424. Wafer 410 is placed between the lower and upper counter-plungers 423 and 424. Counter-plungers 423 and 424 exert no particular pressure on wafer 410. Counter-plunger 423 is brought to a temperature T1 below the silicon melting point, that is, below 1,414° C. Counter-plunger 424 is brought to a temperature T2 greater than the silicon melting point. As a result, counter-plunger 424 will melt the upper surface of wafer 410, which will then recrystallize.

The recrystallization step is short, typically from a few seconds to a few minutes after the melting of the upper surface of the wafer.

The recrystallization step may occur in the same enclosure as that which has been used for the sintering of FIG. 17. Plungers 403 and 404 then play the role of counter-plungers 423 and 424.

The recrystallization step may be performed by other techniques. For example, an area melted by a power beam, such as a light beam, may be created at the upper surface of the wafer, and the molten area is displaced to scan the entire surface of the wafer. There also exist other methods using a scanning system, in which an area is melted across its entire thickness. According to the technique used, to keep its shape to the wafer, it may be refrained from melting the edges, which will be cut back.

Figure 21:
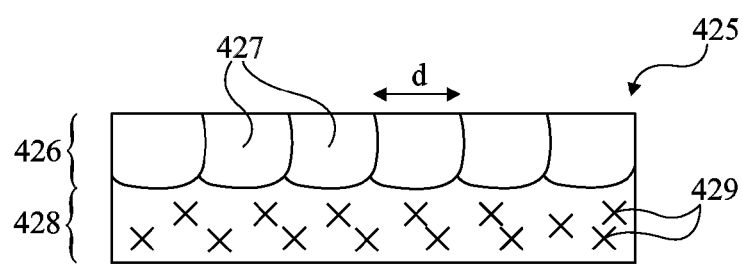

FIG. 21 shows a wafer 425 corresponding to wafer 410 after recrystallization. If it has not totally melted, which is the case in FIG. 21, wafer 425 has an upper portion 426 with large grains 427 and a lower portion 428 with small grains 429. Grains 429 correspond to grains 412 of FIG. 18 and are shown in the same manner. Grains 427 have an average size d. The size of grains 427 is typically greater than or equal to 100 micrometers.

The method for manufacturing an electronic structure according to an aspect of the present invention continues with a step of epitaxial deposition, as will be described in relation with FIG. 22.

Figure 22:
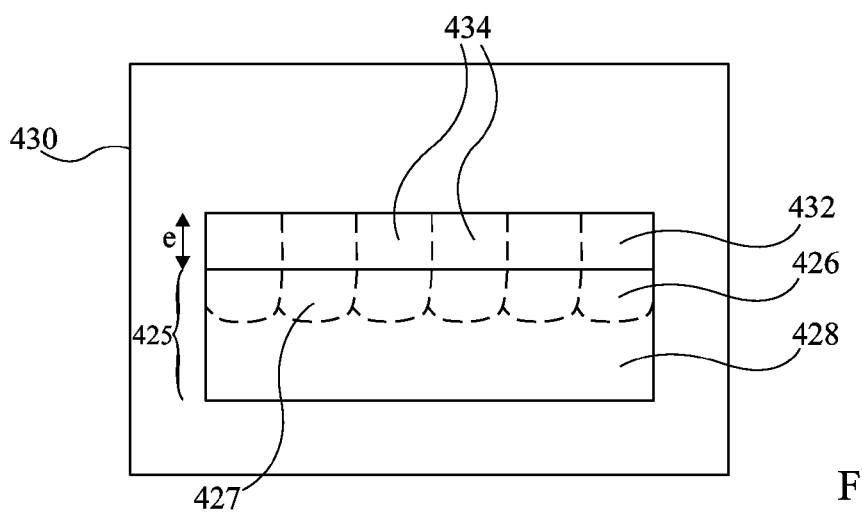

In FIG. 22, wafer 425 is placed on a support, not shown, in an enclosure 430 enabling to epitaxially deposit silicon. An epitaxial silicon layer 432 is deposited on the upper surface of the wafer. The thickness of the epitaxial layer is e. The epitaxy reproduces the structure of the wafer surface, and crystals 434 form in layer 432 in continuation of crystals 427. Crystals 434 reproduce crystals 427 of the recrystallized area. Thickness e of the epitaxial area is selected to be smaller than size d of crystals 427. Typically, thickness e is on the order of from 20 to 50 micrometers. Layer 432 is doped with N-type or P-type dopants, preferably during the epitaxy step. The dopant concentration is preferably smaller than $10^{18}$ atoms/cm³. The epitaxial deposition may be performed by CVD from silane or trichlorosilane gas, by liquid phase epitaxy, by vacuum deposition or evaporation, for example, with a temperature ranging between 900 and 1,200° C. Preferably the temperature does not exceed 1,200° C. to prevent impurity or dopant migrations from wafer 425 into the epitaxial layer. Around 1,200° C., an epitaxial deposition of some twenty micrometers generally takes approximately some twenty minutes. It should be noted that epitaxial deposition 432 is performed on a clean surface. Thus, if an oxide, for example, having a 1-nanometer thickness, has formed at the upper surface of the wafer, it is removed by reduction before the epitaxial deposition.

Liquid phase epitaxy may be carried out using different processes.

For example, silicon and a metal such as aluminum or zinc is melted. The melting occurs at a relatively low temperature, for example, in the range from 800 to 1200° C. A silicon sintered wafer having a recrystallized surface is plunged into the melt. An epitaxial layer with large grains is formed on the recrystallized surface of the wafer, which leads to an electronic structure according to the present invention.

Another process to obtain a liquid phase epitaxy is to provide a melt with silicon only. The temperature is then greater or equal to the silicon melting temperature. The sintered silicon wafer has no need to have a recrystallized surface. One surface of the sintered silicon wafer is plunged into the melt. The wafer is not completely plunged into the melt to avoid its complete melting. A zone of the surface in contact with the melt is melted and the wafer is progressively removed from the melt. Once removed, the surface recrystallizes and is in the same time covered with an epitaxial layer of silicon from the melt. Such a process enables a rapid epitaxy deposition on the surface of the wafer. The control of the process enables an epitaxial layer to be obtained having the desired thickness, for example in the range from 20 to 100 micrometers.

Figure 23:
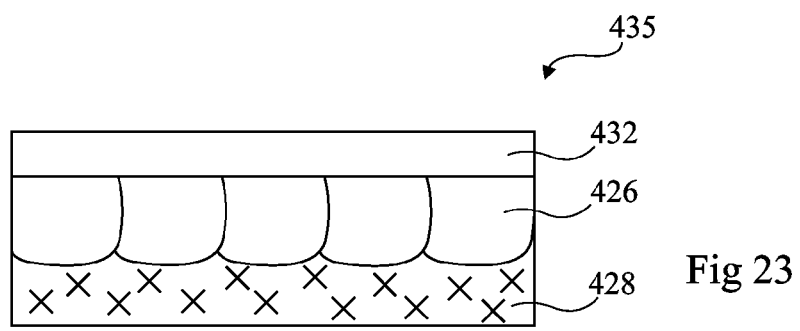
FIG. 23 shows an electronic structure according to another embodiment of the present invention.

FIG. 23 shows an electronic structure 435 according to an embodiment of the present invention.

In FIG. 23, structure 435 includes an area 426 with large grains, an area 428 with small grains, and an epitaxial area 432. Area 428 may have a very small thickness, such as one micrometer. Areas 426 and 428 are heavily doped. Areas 426 and 428 are used as a support for the structure and, due to their doping, may be used as a rear electrode of the structure. The epitaxial layer is lightly doped. The function of the epitaxial area is to be used as an active layer. The epitaxial area may have a homogeneous doping, or several doping layers of different natures and concentrations. The epitaxial layer may be made of pure silicon, or of an alloy of silicon and another semiconductor material, such as germanium. The epitaxial layer may also have various layers of materials of different natures.

Structure 435 may be used to form photovoltaic cells and various other elements, such as electronic or optoelectronic components of integrated circuit type.

Among the advantages of structure 435 over prior art structures, the following should be noted:

Areas 426 and 428, forming the base of structure 435, may have been formed with metallurgic silicon, for example, of u-MG type, which decreases the cost of the structure.

Area 428, when present, is an area that may be porous and have open porosity channels. Advantage may be taken of these channels, if need be, for example, to inject aluminum, which forms and/or improves the ohmic contact.

During the epitaxial growth, a succession of doping layers and/or of layers of different materials, adapted to the final device to be manufactured, may be formed. Thus, the epitaxial layer may comprise a rather thick P-type doped layer, for example, with a thickness on the order of 20 micrometers, topped with an N-type doped layer of small thickness, for example, less than 1 micrometer. It should here be noted that a so-called BSF (Back Surface Field) P+ doped layer may be epitaxially deposited between area 426 and area 432. Such a BSF layer may be advantageous in some embodiments of photovoltaic cells, to prevent the recombination of the carriers created by light.

The method according to an aspect of the present invention enables a reduction in the number of technological steps, since there is no subsequent diffusion step to create the N or P layers.

Various photovoltaic cells and their embodiments will now be described based on an electronic structure according to the present invention, in relation with FIGS. 24 to 27.

Figure 24:
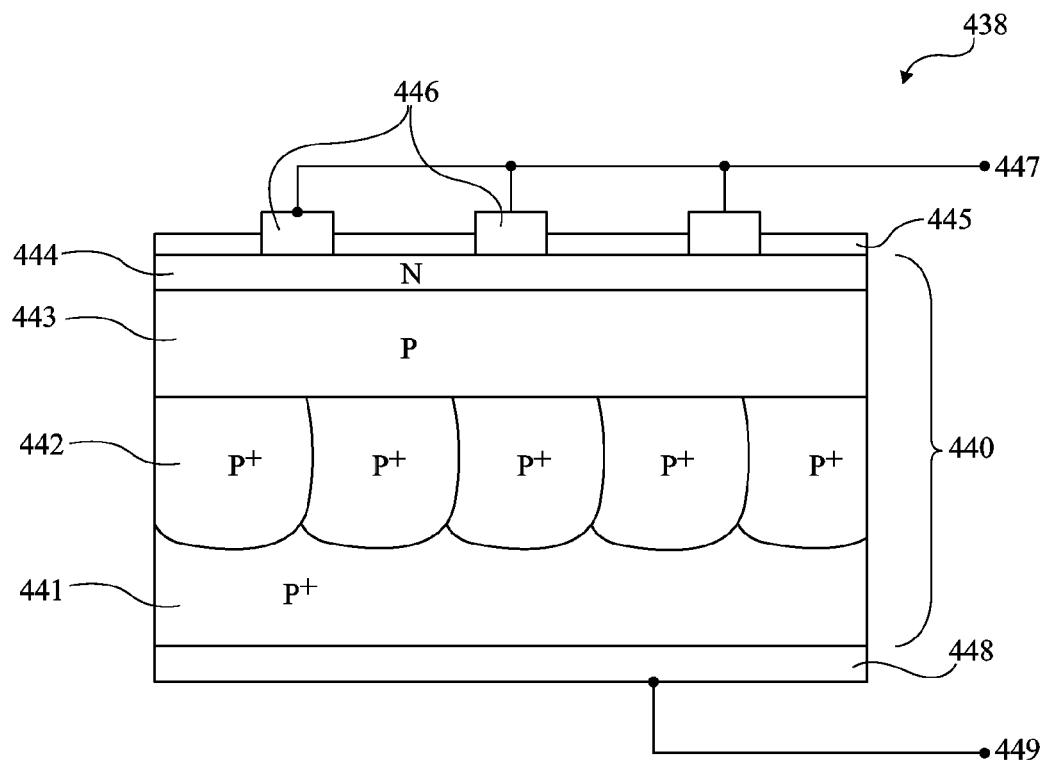
FIGS. 24 to 27 show photovoltaic cells according to various embodiments of the present invention.

In FIG. 24, a photovoltaic cell 438 according to an embodiment of the present invention is formed from an electronic structure 440 according to the present invention.

Structure 440 includes a P+-type doped area 441 with small silicon grains, a P+-type doped area 442 with large silicon grains, a P-type doped layer 443, and an N or N+-type doped layer 444. Areas 441 and 442 result from the sintering of silicon powders, area 442 resulting from a surface recrystallization, performed as described previously. Layers 443 and 444 are two epitaxially-deposited silicon layers. Areas 441 and 442 have a general thickness approximately ranging from 100 to 500 micrometers, layer 443 has a typical thickness on the order of 20 micrometers, and layer 444 has a typical thickness on the order of one micrometer.

On layer 444 of structure 440 is placed an antireflection layer 445 with a surface that may have been texturized to capture as much light as possible. The antireflection layer is a very thin layer, typically on the order of 0.1 micrometer, generally of silicon nitride.

Metal pads 446 forming a comb, for example, made of aluminum, are connected to an output terminal 447. On the lower surface of cell 438, in contact with area 441, is placed a metallization layer 448, for example, made of aluminum, connected to a terminal 449 forming the other output terminal of cell 438. The forming of layer 445 and of the contacting areas is conventional and will not be specifically described.

Cell 438 operates as follows. Charge carriers are created by a photon flow at the PN junction of layers 443 and 444. The charge carriers created by light in areas 443 and 444 are carried off towards terminals 447 and 449 via the respective P+ doped and/or metallic conductive areas.

Structure 440 alone forms most of photovoltaic cell 438. Cell 438 is thus advantageous because structure 440 is inexpensive and may be formed with a few technological steps. Thus, for example, the various dopings may be performed during the forming of the various areas or layers, which avoids subsequent doping steps.

It should further be noted that a significant advantage of structure 440 is the difference in microstructures between area 441 on the one hand and areas 442, 443, and 444 on the other hand. Area 441, formed of generally micronic grains, that is, of grains of dimensions ranging from one to a few micrometers, indeed has a much larger grain boundary density than the other areas, which enables to getter possible impurities introduced into the epitaxial layer(s), such as metal impurities. This gettering effect especially occurs in the structure manufacturing steps, in particular when these steps occur at high temperature, as for example for the deposition steps.

A variation of the photovoltaic cell of FIG. 24 will now be described in relation with FIG. 25.

Figure 25:
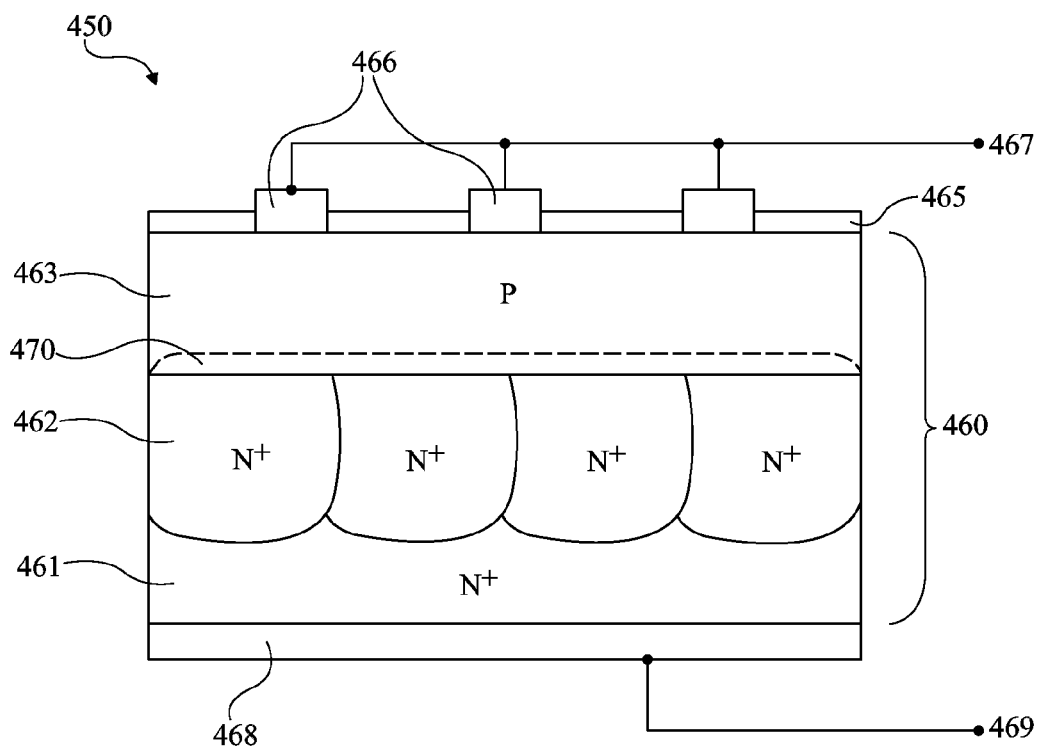

In FIG. 25, a photovoltaic cell 450 according to another embodiment of the present invention includes an electronic structure 460 according to the present invention.

Electronic structure 460 includes an N+-type doped area 461 with small silicon grains, an N+-type doped area 462 with large silicon grains, and a P-type layer 463. Areas 461 and 462 result from the sintering of silicon powders, area 462 resulting from a surface recrystallization, performed as described previously. Layer 463 is an epitaxially-deposited silicon layer. Areas 461 and 462 have a total thickness approximately ranging from 100 to 500 micrometers, and layer 463 has a typical thickness on the order of 20 micrometers.

On layer 463 of structure 460 is placed an antireflection layer 465. Contacting areas 466 are connected to an output terminal 467 of photovoltaic cell 450. On the lower surface of cell 450, in contact with area 461, is placed a metallization layer 468 connected to a terminal 469 forming the other output terminal of cell 450. The antireflection layer and the various contacting areas of FIG. 25 are similar to the corresponding antireflection layer and contacting areas of FIG. 24 and will not be described any further.

Cell 450 of FIG. 25 operates as follows.

During the epitaxial forming of layer 463, the dopants of layer 462 slightly diffuse by forming, in the epitaxial area, an N-type doped area 470 shown in dotted lines in FIG. 25. The PN junction necessary for the cell operation here is at the level of area 470 and of layer 463. Once created by light, the charge carriers migrate towards terminals 467 and 469 of the photovoltaic cell.

Photovoltaic cell 450 has, like cell 438 of FIG. 24, all the advantages linked to the use of an electronic structure according to various embodiments of the present invention. It further has the following advantages.

On the one hand, since sintered support 461, 462 takes part in the junction, it is unnecessary to provide, as in FIG. 24, an N or N+-type doped epitaxial layer on the P-type epitaxial layer. Cell 450 is thus simpler to form than cell 438, which results in time and manufacturing cost savings.

On the other hand, since the PN junction is at the base of layer 463, adjacent to layer 462, the absorption of power by layer 444 of FIG. 24, which is due to the fact for the N or N+ layer to be at the surface, is avoided.

Another variation of the photovoltaic cell of FIG. 24 will now be described in relation with FIG. 26.

Figure 26:
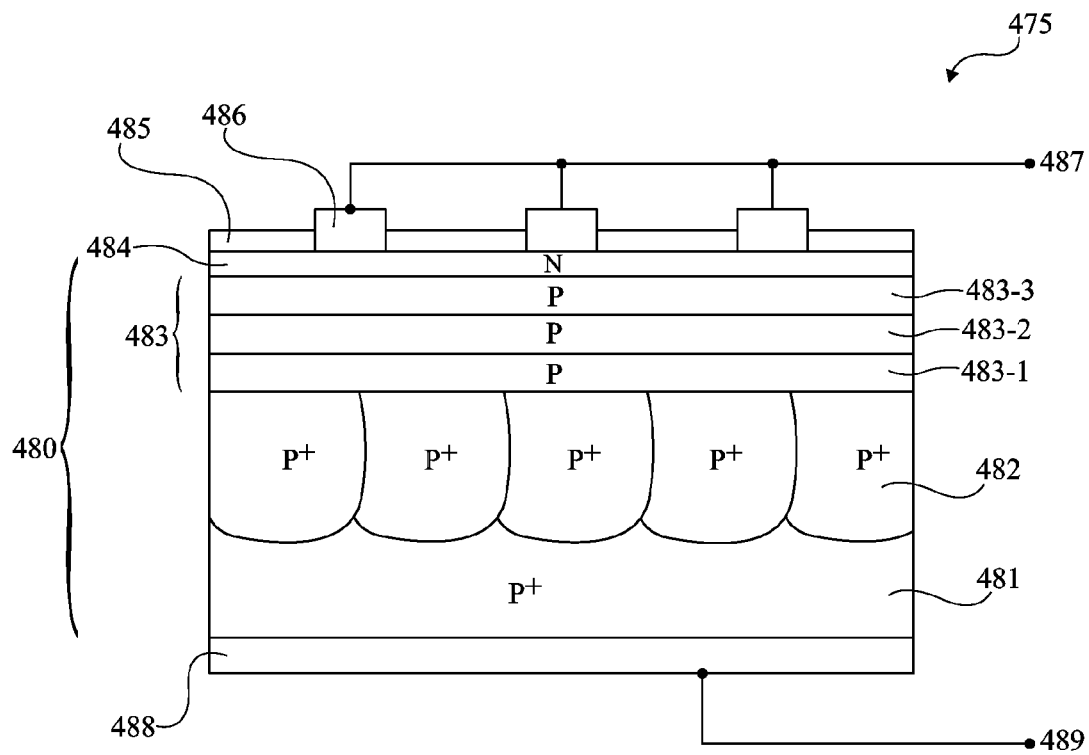

In FIG. 26, a photovoltaic cell 475 according to yet another embodiment of the present invention includes an electronic structure 480 according to the present invention.

Electronic structure 480 includes a P+-type doped area 481 with small silicon grains, a P+-type doped area 482 with large silicon grains, a layer 483 formed of several P-type doped sub-layers 483-1 to 483-$n$, and an N or N+-type doped layer 484. Areas 481 and 482 result from the sintering of silicon powders, area 482 resulting from a surface recrystallization performed as described previously. Areas 481 and 482 have a general thickness approximately ranging from 100 to 500 micrometers. Layer 484 has a typical thickness on the order of one micrometer.

Layer 483 is formed of sub-layers 483-$i$, with i ranging from 1 to n, which have been epitaxially deposited and P-type doped. Each sub-layer 483-$i$ is formed of a material having chemical formula $Si_xGe_{1-x}$, where the value of x may range from 0 to 1. Thus, sub-layer 483-1 in contact with area 482 may be pure germanium, while the next sub-layers are silicon and germanium alloys with an increasing silicon content, to reach pure silicon in sub-layer 483-$n$. Layer 483 has a typical total thickness approximately ranging from 20 to 50 micrometers. Preferably, the number of sub-layers 483-$i$ is limited, for example, to three or four. Three sub-layers 483-1 to 483-3 have been shown in FIG. 26. Each of the layers may be doped during the deposition with variable dopant concentrations. In addition to electronic structure 480, photovoltaic cell 475 includes an antireflection layer 485, metallization pads 486 connected to a first terminal 487 of the cell, as well as a rear metallization layer 488 connected to a second terminal 489 of the cell. Since these elements have been described and have an analogous functions, they will not be discussed any further.

In addition to the advantages of using an electronic structure according to the present invention (low cost, and manufacturing simplicity), the photovoltaic cell of FIG. 26 is advantageous since it has a greater efficiency than cell 438 of FIG. 24.

Indeed, the energy gaps of silicon, germanium, and the silicon-germanium alloys being different, more electron-hole pairs are created since the photon power is better used than in the case of pure silicon. In particular, the infrared portion of the solar spectrum is converted with a greater efficiency if a structure where the layers contain more silicon on the surface exposed to light and more germanium in the underlying layer is formed. Further, the use of germanium enables to have a higher carrier mobility and a better conductivity, as well as an enhanced ohmic contact with the conductive areas.

Figure 27:
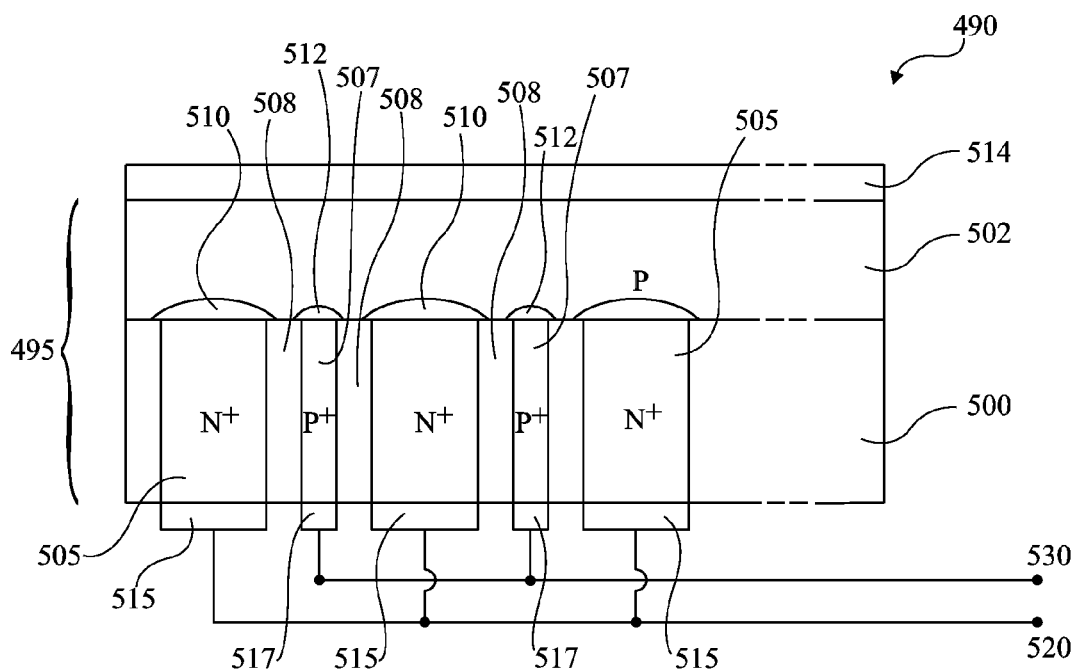

FIG. 27 shows yet another embodiment of a photovoltaic cell according to the present invention.

In FIG. 27, a photovoltaic cell 490 includes an electronic structure 495 according to the present invention. Structure 495 includes a lower support 500 and an upper layer 502.

Lower support 500 originates from a sintered silicon wafer doped as described in FIG. 19. Thus, support 500 comprises N+-type doped areas 505, alternating with P+-type doped areas 507. Areas 505 typically have a width on the order of two millimeters and areas 507 typically have a width on the order of one millimeter. Between areas 505 and 507 are located areas 508 that may have been made insulating by the addition of an insulator into the porosity channels. Support 500 has large grains, of a size typically greater than or equal to 100 micrometers, at its upper surface in contact with layer 502. Such large grains result from a surface recrystallization and have not been shown in FIG. 27 to avoid complexity in the drawing. Support 500 generally has small grains in its lower portion, which has remained porous. The thickness of support 500 approximately ranges from 100 to 500 micrometers, as in the case of the previously-described cells.

Layer 502 results from the epitaxial deposition of silicon on the recrystallized surface of support 500. Layer 502 is P-type doped.

At the base of layer 502, in contact with support 500, N-type doped areas 510 and P-type doped areas 512 may be found. Areas 510 are adjacent to areas 505 and areas 512 are adjacent to areas 507. Areas 510 and areas 512 have been obtained during a diffusion step which has diffused the dopants of areas 505 and 507 into layer 502. The diffusion may be obtained by heating at a temperature on the order of 900° C. after the epitaxial deposition of layer 502. Diffusion may also occur during the epitaxial deposition of layer 502 and a subsequent diffusion step may result being unnecessary. On the upper surface of layer 502 is placed an antireflection layer 514 similar to the antireflection layer of the previously-described cells.

On the lower surface of structure 495 are placed pads 515 opposite to areas 505 and pads 517 opposite to areas 507. Pads 515 and 517 are metallic, for example, made of aluminum. Pads 515 are connected to a terminal 520 and pads 517 are connected to a terminal 530. Terminals 520 and 530 form the two output terminals of cell 490.

Photovoltaic cell 490 operates as follows.

The PN junction is located at the level of areas 510 and of epitaxial layer 502. Areas 507 are narrower than areas 505 since their function is different. Indeed, areas 507 are used, via areas 512, to promote the ohmic contact with epitaxial area 502. N+-type doped areas 505 are also used to promote the ohmic contact with metal areas 515.

Photovoltaic cell 490 has, on the one hand, all the advantages due to the presence of an electronic structure according to an embodiment of the present invention.

On the other hand, in cell 490, all electric contacts are made on the lower cell surface. There is no collector comb at the cell surface exposed to the radiation. As a result, a larger surface area is available to receive the radiation, which brings about an improved efficiency of the cell.

Further, cell 490 has no specific surface dopings, like layer 444 of FIG. 24, which are generally quite high and absorb part of the light.

It should be noted that photovoltaic cell 490 cannot be formed with a conventional substrate made of single-crystal silicon or polysilicon, since a single-crystal silicon or polysilicon substrate does not enable to perform the doping illustrated in FIG. 19.

Various embodiments with different variations have been described hereabove. It should be noted that those skilled in the art may modify or combine various elements of these various embodiments and variations without showing any inventive step.

For example, in cells 438, 450, and 490, the epitaxial layer may include several sub-layers of variable formulas $Si_xGe_{1-x}$ and of variable doping as in the case of cell 475.

Also, the various thicknesses and magnitudes have been given by way of non-limiting examples only. For example, due to the low cost of sintering, the supports of the structures or cells according to the present invention may be thicker, for example, with a thickness ranging from one to several millimeters if desired.

Thus, the thickness of the epitaxial layer has been described as approximately ranging from 20 to 50 micrometers. Of course, the epitaxial layer may be thinner, for example, of 10 micrometers, or thicker, for example up to 100 or 150 micrometers.

Of course, in all the previously-described examples of electronic structures or of cells, the nature of the dopants may be inverted. For example, the P or P+-type doped areas of a structure or cell may be replaced with N or N+-type doped areas, the N or N+-type doped areas of the structure or of the cell being replaced with P or P+-type areas.

Also, support wafer 410 or 425 may be without doping. For example, in such a case, the contacts of a photovoltaic cell made with such a support will be placed either on the front face of the cell or on the rear face of the cell, metalized holes traversing the support and enabling the contact with the epitaxial active layer.

It should also be noted that the structures of the present invention, which enable to form photovoltaic cells, may be used in other devices, the epitaxial area being used as an active area. Examples of such applications for example are integrated circuits of electronic or optoelectronic type.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electronic structure comprising:
   a first area comprising silicon grains having a size smaller than 100 micrometers;
   a second area superposed to the first area and comprising silicon grains having a size greater than or equal to 100 micrometers, the first and second areas forming a support; and at least one layer of an epitaxial semiconductor material on the second area.

2. The structure of claim 1, wherein the support has a doping concentration greater than $10^{18}$ atoms/cm$^3$ obtained by means of dopants of at least one of a first and a second type, and wherein the at least one epitaxial layers has a doping concentration lower than $10^{18}$ atoms/cm$^3$ obtained by means of dopants of at least one of the first and the second type.

3. The structure of claim 1, wherein the thickness of the at least one epitaxial layer is smaller than the size of the silicon grains of the second area.

4. The structure of claim 1, further comprising:
a first epitaxial layer adjacent to the support and doped with a dopant of same nature as that of the support; and
a second epitaxial layer thinner than the first layer, doped with a dopant of a different nature than that of the support.

5. The structure of claim 1, further comprising an epitaxial layer adjacent to the support and doped with a dopant of different nature than that of the support.

6. The structure of claim 1, wherein the support comprises:
third areas having a doping of the first type and alternating with fourth areas having a doping of the second type, and
wherein the epitaxial layer, doped with a dopant of the second type, comprises:
fifth doped areas of the first or of the second type, the doping of the fifth areas resulting from the diffusion of the dopants of the third and fourth areas.

7. The structure of claim 1, wherein the at least one epitaxial layer comprises a plurality of sub-layers of materials of different natures.

8. The structure of claim 7, wherein the materials of the sub-layers are one of pure silicon, pure germanium, and a silicon and germanium alloy of formula $Si_xGe_{1-x}$, wherein x is a parameter that ranges from 0 to 1, depending on the considered sub-layer.

9. The structure of claim 6, wherein the first type of doping is a doping of N or N+ type and the second type of doping is a doping of P or P+ type.

10. The structure of claim 1, wherein the thickness of the support is greater than 100 micrometers, the thickness of the first area ranging between a minimum thickness equal to zero and a maximum thickness equal to the thickness of the support minus 100 micrometers.

11. The structure of claim 1, wherein the epitaxial layer is obtained by liquid phase epitaxy.

12. The structure of claim 11, wherein the epitaxial layer is obtained by plunging the surface of the support into a silicon melt.

13. The structure of claim 1, wherein the support is not planar.

14. A photovoltaic cell comprising:
an electronic structure comprising:
a first area comprising silicon grains having a size smaller than 100 micrometers;
a second area superposed to the first area and comprising silicon grains having a size greater than or equal to 100 micrometers, the first and second areas forming a support; and
at least one layer of an epitaxial semiconductor material on the second area.

15. The photovoltaic cell of claim 14, further comprising at least one of an antireflection layer and ohmic contact areas arranged on first and second cell surfaces.

16. The photovoltaic cell of claim 14, further comprising at least one of an antireflection layer and ohmic contact areas arranged on a single surface of the cell.

* * * * *